(12) United States Patent
Shin et al.

(10) Patent No.: US 11,538,834 B2
(45) Date of Patent: Dec. 27, 2022

(54) DISPLAY DEVICE

(71) Applicant: Samsung Display Co., LTD., Yongin-si (KR)

(72) Inventors: Dong Chul Shin, Hwaseong-si (KR); Hyun Sup Lee, Seoul (KR); Kang Young Lee, Seongnam-si (KR); Gye Hwan Lim, Incheon (KR)

(73) Assignee: Samsung Display Co., LTD., Yongin-si (KR)

( * ) Notice: Subject to any disclaimer, the term of this patent is extended or adjusted under 35 U.S.C. 154(b) by 34 days.

(21) Appl. No.: 16/579,832

(22) Filed: Sep. 24, 2019

(65) Prior Publication Data

US 2020/0295047 A1  Sep. 17, 2020

(30) Foreign Application Priority Data

Mar. 15, 2019  (KR) .................. 10-2019-0029992

(51) Int. Cl.
| | | |
|---|---|---|
| *H01L 27/14* | (2006.01) | |
| *H01L 27/12* | (2006.01) | |
| *G02F 1/1368* | (2006.01) | |
| *G02F 1/1362* | (2006.01) | |
| *G02F 1/136* | (2006.01) | |

(52) U.S. Cl.
CPC .......... *H01L 27/124* (2013.01); *G02F 1/1368* (2013.01); *G02F 1/136286* (2013.01); *G02F 1/13606* (2021.01); *G02F 1/13629* (2021.01); *G02F 1/13685* (2021.01)

(58) Field of Classification Search
CPC ............. G02F 1/136286; G02F 1/1368; G02F 1/13606; G02F 1/13629; H01L 27/124
See application file for complete search history.

(56) References Cited

U.S. PATENT DOCUMENTS

| | | | | |
|---|---|---|---|---|
| 4,948,231 | A | * | 8/1990 | Aoki ...................... G02F 1/1368 257/59 |
| 4,984,033 | A | * | 1/1991 | Ishizu ................. H01L 21/0242 257/98 |

(Continued)

FOREIGN PATENT DOCUMENTS

| | | |
|---|---|---|
| KR | 10-2017-0126632 | 1/2007 |
| KR | 10-2017-0058475 | 5/2017 |
| KR | 10-2007-0003178 | 11/2017 |

OTHER PUBLICATIONS

Lee et al., Large-area Ultra-high Density 5.36" 10Kx6K 2250 ppi Display, Invited Paper, May 2018, pp. 607-609, SID vol. 49, Issue 1, Display Research Center, Samsung Display, Korea.

*Primary Examiner* — Jay C Kim
(74) *Attorney, Agent, or Firm* — H.C. Park & Associates, PLC

(57) ABSTRACT

A display device includes a substrate; at least one data line disposed on the substrate; a first pattern disposed on the substrate and spaced apart from the data line; a first insulating layer at least partially disposed on the data line and the first pattern; an active layer disposed on the first insulating layer and at least partially overlapping with the first pattern; a first gate insulating layer disposed on the active layer; and a first electrode disposed on the first gate insulating layer and overlapping with the active layer, wherein the first electrode does not overlap with the data line in a direction parallel to an upper surface of the first insulating layer.

9 Claims, 16 Drawing Sheets

(56) References Cited

U.S. PATENT DOCUMENTS

| | | | | |
|---|---|---|---|---|
| 5,121,236 A * | 6/1992 | Ukai | G02F 1/136259 | 349/55 |
| 5,233,211 A * | 8/1993 | Hayashi | H01L 21/86 | 257/347 |
| 5,510,916 A * | 4/1996 | Takahashi | G02F 1/136209 | 349/110 |
| 5,672,888 A * | 9/1997 | Nakamura | G02F 1/136213 | 257/408 |
| 5,942,310 A * | 8/1999 | Moon | G02F 1/136213 | 428/195.1 |
| 6,297,862 B1 * | 10/2001 | Murade | G02F 1/136209 | 349/110 |
| 6,327,006 B1 * | 12/2001 | Sato | G02F 1/136209 | 349/44 |
| 6,380,561 B1 * | 4/2002 | Ohtani | G02F 1/136213 | 257/71 |
| 6,573,955 B2 * | 6/2003 | Murade | G02F 1/136209 | 349/44 |
| 6,583,472 B1 * | 6/2003 | Shibata | G02F 1/13454 | 257/350 |
| 6,605,827 B2 * | 8/2003 | Katayama | G02F 1/1368 | 257/71 |
| 6,680,488 B2 * | 1/2004 | Shibata | H01L 29/78633 | 257/72 |
| 6,770,908 B2 * | 8/2004 | Sato | H01L 29/78633 | 257/59 |
| 6,909,240 B2 * | 6/2005 | Osame | H01L 27/3265 | 315/169.1 |
| 6,927,809 B2 * | 8/2005 | Gotoh | H01L 29/78633 | 257/E27.113 |
| 7,268,843 B2 * | 9/2007 | Kawata | G02F 1/136286 | 349/110 |
| 7,465,957 B2 * | 12/2008 | Arao | G02F 1/136209 | 257/59 |
| 7,507,998 B2 * | 3/2009 | Tseng | H01L 27/3272 | 257/72 |
| 7,541,618 B2 * | 6/2009 | Shibata | G02F 1/136213 | 257/350 |
| 7,969,518 B2 * | 6/2011 | Yamasaki | G02F 1/136209 | 349/38 |
| 7,982,839 B2 * | 7/2011 | Choi | G02F 1/133555 | 349/141 |
| 8,168,982 B2 * | 5/2012 | Ishii | H01L 29/78633 | |
| 8,465,995 B2 * | 6/2013 | Jung | H01L 29/78633 | 439/126 |
| 8,922,464 B2 * | 12/2014 | Inoue | G09G 3/3233 | 345/76 |
| 9,082,854 B2 * | 7/2015 | Ito | H01L 27/124 | |
| 9,231,000 B2 * | 1/2016 | Ko | H01L 27/1255 | |
| 9,489,885 B2 * | 11/2016 | Jeon | G09G 3/3208 | |
| 9,559,125 B2 * | 1/2017 | Sun | H01L 27/124 | |
| 9,581,850 B2 * | 2/2017 | Lee | G02F 1/136213 | |
| 9,627,465 B2 * | 4/2017 | Kwon | H01L 27/1225 | |
| 9,647,006 B2 * | 5/2017 | I | H01L 29/78621 | |
| 9,853,068 B2 * | 12/2017 | Miyake | H01L 27/1255 | |
| 9,965,122 B2 * | 5/2018 | Kim | G06F 3/04184 | |
| 10,088,727 B2 * | 10/2018 | Wada | H01L 29/42384 | |
| 10,128,273 B2 * | 11/2018 | Su | H01L 27/1222 | |
| 10,139,690 B2 * | 11/2018 | Lin | H01L 27/1262 | |
| 10,192,895 B2 * | 1/2019 | Abe | H01L 29/78627 | |
| 10,199,449 B2 * | 2/2019 | Kim | H01L 27/3258 | |
| 10,230,074 B2 * | 3/2019 | Pyon | H01L 27/3248 | |
| 10,304,860 B2 * | 5/2019 | Zhang | H01L 29/41733 | |
| 10,438,977 B2 * | 10/2019 | Noh | H01L 29/78633 | |
| 10,620,494 B2 * | 4/2020 | Oikawa | G02F 1/136286 | |
| 10,622,436 B2 * | 4/2020 | Park | G09G 3/3258 | |
| 10,656,483 B2 * | 5/2020 | Matsukizono | G02F 1/136209 | |
| 10,784,329 B2 * | 9/2020 | Kim | H01L 27/3276 | |
| 10,802,367 B2 * | 10/2020 | Choi | G02F 1/1368 | |
| 10,847,741 B2 * | 11/2020 | Iizuka | H01L 51/5253 | |
| 11,106,096 B2 * | 8/2021 | Kimura | G02F 1/133707 | |
| 11,126,052 B2 * | 9/2021 | Ozeki | H01L 29/78633 | |
| 2013/0300968 A1 * | 11/2013 | Okajima | H01L 27/124 | 257/66 |
| 2015/0311232 A1 * | 10/2015 | Sun | H01L 27/124 | 257/72 |
| 2016/0276376 A1 * | 9/2016 | Sun | H01L 27/124 | |
| 2017/0322471 A1 * | 11/2017 | Jeong | G02F 1/136286 | |
| 2018/0175077 A1 * | 6/2018 | Koo | H01L 27/127 | |

* cited by examiner

DISPLAY DEVICE

CROSS REFERENCE TO RELATED APPLICATION

This application claims priority from and the benefit of Korean Patent Application No. 10-2019-0029992, filed on Mar. 15, 2019, which is hereby incorporated by reference for all purposes as if fully set forth herein.

BACKGROUND

Field

Exemplary embodiments of the invention relate generally to a display device and, more specifically, to a display device that can reduce a parasitic capacitor between a drain electrode of a transistor and data lines.

Discussion of the Background

Display devices become more and more important as multimedia technology evolves. Accordingly, a variety of types of display devices such as organic light-emitting display (OLED) devices and liquid-crystal display (LCD) devices are currently used.

Display devices are for displaying images and include a display panel such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

The size of such display devices is getting smaller and smaller in order to achieve an ultra-high resolution. As a result, it is difficult to provide a sufficient space between the transistors and the lines disposed in adjacent pixels, thereby lowering the reliability of the display devices. Additionally, a parasitic capacitor may occur within each pixel.

The above information disclosed in this Background section is only for understanding of the background of the inventive concepts, and, therefore, it may contain information that does not constitute prior art.

SUMMARY

Devices constructed according to exemplary implementations/embodiments of the invention are capable of providing a display device that can reduce a parasitic capacitor between a drain electrode of a transistor and data lines Additional features of the inventive concepts will be set forth in the description which follows, and in part will be apparent from the description, or may be learned by practice of the inventive concepts.

According to an exemplary embodiment of the inventive concepts, a display device may include data lines and a first electrode, and may include a first pattern that prevents the data lines from overlapping with the first electrode in a horizontal direction. Accordingly, it is possible to implement a display device with a small pixel size while reducing a parasitic capacitor between data lines and a first electrode.

According to an exemplary embodiment of the inventive concepts, a display device includes a substrate; at least one data line disposed on the substrate; a first pattern disposed on the substrate and spaced apart from the data line; a first insulating layer at least partially disposed on the data line and the first pattern; an active layer disposed on the first insulating layer and at least partially overlapping with the first pattern; a first gate insulating layer disposed on the active layer; and a first electrode disposed on the first gate insulating layer and overlapping with the active layer, wherein the first electrode does not overlap with the data line in a direction parallel to an upper surface of the first insulating layer.

In an exemplary embodiment, the first electrode may not overlap with the data line in a direction perpendicular to the upper surface of the first insulating layer.

In an exemplary embodiment, a width of the first pattern may be larger than a width of the active layer, and a height of the first pattern may be equal to a height of the data line.

In an exemplary embodiment, at least a part of the first pattern may overlap with the first electrode.

In an exemplary embodiment, at least a part of the active layer may overlap with the data line.

In an exemplary embodiment, the first insulating layer may include a first contact hole passing through the first insulating layer so that a part of the data line is exposed, and wherein the active layer is connected to the data line through the first contact hole.

In an exemplary embodiment, at least a part of the data line may overlap with the active layer on the first gate insulating layer, and wherein the data line is in contact with a part of the active layer via the a second contact hole passing through the first gate insulating layer.

In an exemplary embodiment, the display device may further include a second insulating layer disposed between the first gate insulating layer and the first electrode; and a gate line disposed between the first gate insulating layer and the second insulating layer.

In an exemplary embodiment, the first electrode may be in contact with the active layer via a third contact hole passing through the first gate insulating layer and the second insulating layer so that at least a part of the active layer is exposed via the third contact hole.

In an exemplary embodiment, a height of the third contact hole may range from 0.5 to 0.7 μm, and a width of the second contact hole ranges from 1.5 to 1.8 μm.

According to another embodiment of the inventive concepts, a display device includes a first data line extended in a first direction; a second data line extended in the first direction and spaced apart from the first data line in a second direction; a first pattern disposed between the first data line and the second data line; a first active layer at least partially disposed on the first pattern and located above the first data line and the second data line; a gate line extended in the second direction and at least partially overlapping with the first active layer; and a first electrode disposed on the first active layer and overlapping with at least a part of the first pattern, wherein the first electrode is spaced apart from the first data line and the second data line.

In an exemplary embodiment, the first pattern may be extended in the first direction between the first data line and the second data line.

In an exemplary embodiment, the first pattern may be disposed where the first active layer overlaps with the gate line.

In an exemplary embodiment, a width of the first pattern measured in the second direction may be larger than a width of the first active layer.

In an exemplary embodiment, at least a part of the first active layer may be bent in the second direction and overlap with the first data line.

In an exemplary embodiment, the display device may further include a third data line spaced apart from the second data line in the second direction; a second pattern disposed between the second data line and the third data line; and a second active layer disposed between the second data line and the third data line, wherein at least a part of the second active layer is bent in the second direction to overlap with the second data line.

In an exemplary embodiment, the gate line may include: a first straight portion extended in the second direction and overlapping with the first active layer; a second straight portion bent in the first direction from the first straight portion and overlapping with the second data line; and a third straight portion bent in the second direction from the second straight portion and overlapping with the second active layer, wherein a line extended from the first straight portion is spaced apart from a line extended from the third straight portion in the first direction.

According to the other embodiment of the inventive concepts, a display device includes a first substrate; one or more data lines disposed on the first substrate and spaced apart from one another; a first insulating layer disposed over the data lines; an active layer first on the first insulating layer; a first gate insulating layer disposed over the active layer; a gate line disposed on the first gate insulating layer and partially overlapping with the data lines; a second insulating layer disposed over the gate line and the first gate insulating layer; and a first electrode disposed on the second insulating layer and partially overlapping with the active layer, wherein the first electrode does not overlap with the data lines in a direction parallel to an upper surface of the first insulating layer.

In an exemplary embodiment, the display device may further include a third insulating layer disposed between the first insulating layer and the active layer, wherein the first insulating layer comprises an organic insulating material while the third insulating layer comprises an inorganic insulating material.

In an exemplary embodiment, the first electrode may be in contact with at least a part of the active layer via a contact hole passing through the first gate insulating layer and the second insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
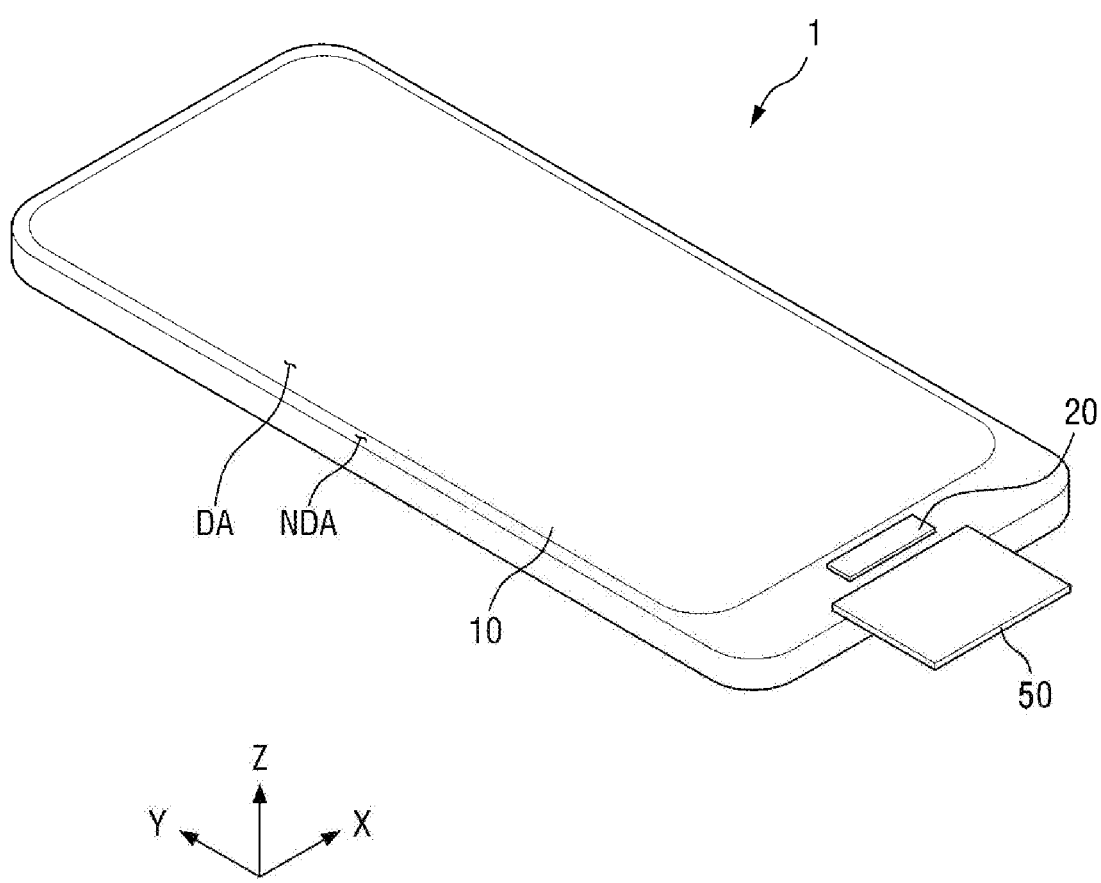
FIG. 1 is a perspective view showing a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the dr1-axis, the dr2-axis, and the dr3-axis are not limited to three axes of a rectangular coordinate system, such as the X, Y, and Z—axes, and may be interpreted in a broader sense. For example, the dr1-axis and the dr2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
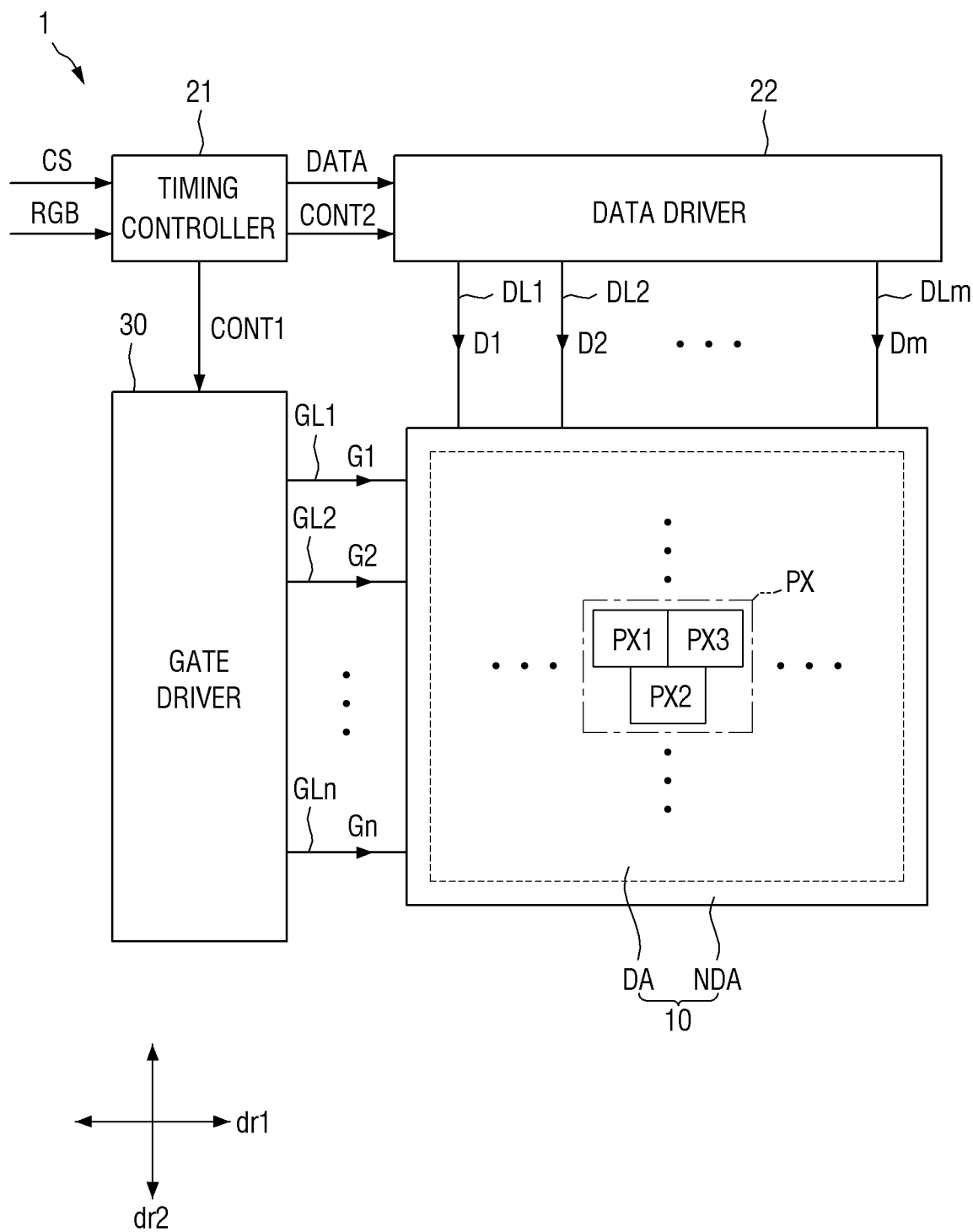
FIG. 2 is a block diagram of a display device according to an exemplary embodiment of the inventive concepts.

FIG. 1 is a perspective view of a display device according to an exemplary embodiment of the inventive concepts. FIG. 2 is a block diagram of a display device according to an exemplary embodiment of the inventive concepts.

As used herein, the terms "above," "top" and "upper surface" refer to the upper side of the display device 1, i.e., the side indicated by the arrow in the z-axis direction, whereas the terms "below," "bottom" and "lower surface" refer to the opposite side in the z-axis direction. As used herein, the terms "left," "right," "upper" and "lower" sides indicate relative positions when the display device 1 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

Referring to FIGS. 1 and 2, a display device 1 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things. The display device 1 may be one of an organic light-emitting display device, a liquid-crystal display device, a plasma display device, a field emission display device, an electrophoretic display device, an electrowetting display device, a quantum dot light-emitting display device, a micro LED display device and the like. In the following description, a liquid-crystal display device is described as an example of the display device 1. It is, however, to be understood that the inventive concepts are not limited thereto.

The display device 1 according to an exemplary embodiment of the inventive concepts includes a display panel 10, a display driving circuit 20 and a circuit board 50.

The display panel 10 may be formed in a rectangular plane having shorter sides in a first direction (x-axis direction) and longer sides in a second direction (y-axis direction) intersecting the first direction (x-axis direction). Each of the corners where the short side in the first direction (x-axis direction) meets the longer side in the second direction (y-axis direction) may be rounded with a predetermined curvature or may be a right angle. The shape of the display panel 10 when viewed from the top is not limited to a quadrangular shape, but may be formed in a different polygonal shape, a circular shape, or an elliptical shape. The display panel 10 may be, but is not limited to being, formed to be flat. The display panel 10 may include curved portions formed at left and right ends thereof and having a constant or varying curvature. In addition, the display panel 10 may be formed to be flexible so that it can be curved, bent, folded or rolled.

The display panel 10 may include a display area DA where pixels PX are formed to display images, and a non-display area NDA which is the peripheral area of the display area DA. When the display panel 10 includes a curved portion, the display area DA may be disposed on the curved portion. In such case, the image of the display panel 10 can also be seen on the curved portion.

In the display area DA, not only the pixels PX but also gate lines GL1-GLn, data lines DL1-DLn and power lines connected thereto may be arranged. The gate lines GL1-GLn may be arranged in the first direction (x-axis direction), while the data lines DL1-DLn may be arranged in the second direction (y-axis direction) intersecting the first direction (x-axis direction). Each of the pixels PX may be connected to at least one of the gate lines GL1-GLn and at least one of the data lines DL1-DLn.

The gate driver 30 may generate the first to the $n^{th}$ gate signals G1 to Gn based on the first control signal CONT1 supplied from the timing controller 21. The gate driver 30 may supply the generated first to $n^{th}$ gate signals G1 to Gn to the plurality of pixels PX disposed on the display panel 10 through the first to $n^{th}$ gate lines GL1 to GLn. For example, the gate driver 30 may be implemented as a plurality of switching elements or may be an integrated circuit.

The data driver 22 may receive a second control signal CONT2 and image data DATA from the timing controller 21. The data driver 22 may generate the first to $m^{th}$ data signals D1 to Dm based on the second control signal CONT2 and the image video data DATA. The data driver 22 may provide the generated first to $m^{th}$ data signals D1 to Dm to the plurality of pixels PX disposed in the display panel 10 through the first to $m^{th}$ data lines DL1 to DLm. The data driver 22 may include a shift register, a latch, a digital-to-analog converter, etc.

The timing controller 21 may receive an image signal RGB and a control signal CS from an external device. The timing controller 21 may process the image signal RGB and the control signal CS appropriately for the operating conditions of the display panel 10 to generate the image data DATA, the first control signal CONT1 and the second control signal CONT2. In an exemplary embodiment, the timing controller 21 may generate the first control signal CONT1 and the second control signal CONT2 that are appropriate for a predetermined frequency (e.g., 1 Hz to 120 Hz) driving scheme.

The image signal RGB may include a plurality of gray-scale data items to be provided to the display panel 10. In addition, the control signal CS may include a horizontal synchronization signal, a vertical synchronization signal, and a main clock signal. The horizontal synchronization signal represents the time taken to display a single line of the display panel 10. The vertical synchronization signal represents the time taken to display an image of a single frame. The main clock signal is a signal used as a reference when the timing controller 21 is in synchronization with each of the gate driver 30 and the data driver 22 for generating various signals.

The display driving circuit 20 is connected to display pads and receives digital video data and timing signals. The display driving circuit 20 converts the digital video data into analog positive/negative data voltages and supplies them to the data lines DL1-DLn through routing lines and a data voltage dividing circuit DMUX. In addition, the display driving circuit 20 may supply the supply voltages to the power lines.

The display driving circuit 20 may be implemented as an integrated circuit (IC) and may be attached to the display panel 10 in a pad area PDA by a chip on glass (COG) technique, a chip on plastic (COP) technique, or an ultrasonic bonding. For example, the display driving circuit 20 may be mounted on the circuit board 50.

The pads may be electrically connected to the display driving circuit 20. The circuit board 50 may be attached to the pads using an anisotropic conductive film. In this manner, the lead lines of the circuit board 50 may be electrically connected to the pads. The circuit board 50 may be a flexible printed circuit board, a printed circuit board, or a flexible film such as a chip on film.

A plurality of pixels PX may be arranged in the display area DA of the display panel 10. Each of the pixels PX may include a first sub-pixel PX1, a second sub-pixel PX2 and a third sub-pixel PX3. Although each of the pixels PX may include the first sub-pixel PX1, the second sub-pixel PX2 and the third sub-pixel PX3 in the example shown in FIG. 2, this is merely illustrative. Each of the pixels PX may include a greater number of sub-pixels PXn.

In an exemplary embodiment, each of the pixels PX may include two sub-pixels PXn disposed adjacent to each other in a direction and one sub-pixel PXn disposed adjacent to the two sub-pixels PXn in another direction. As shown in the drawings, each pixel PX may include a first sub-pixel PX1 and a third sub-pixel PX3 adjacent to each other in a first direction dr1, and a second sub-pixel PX2 adjacent to the face where the first sub-pixel PX1 meets the third sub-pixel PX3 in the second direction dr2. That is to say, according to an exemplary embodiment of the inventive concepts, each pixel PX includes a plurality of sub-pixels PXn, and each of the sub-pixels PXn may be arranged in a staggered manner. The unit area occupied by each of the pixels PX or the sub-pixels PXn is reduced, thereby achieving the ultra-high resolution display device 1. By arranging the sub-pixels PXn included in each pixel PX in a staggered manner, the area occupied by each pixel PX can be reduced.

In the sub-pixel PXn having such a structure, the gate line GL may include first straight portions extended in the first direction dr1, second straight portions extended in the second direction dr2, a plurality of bent portions connecting between them, such that a first straight portion of a single gate line GL may be spaced apart from another first straight portion disposed in sub-pixels PXn adjacent thereto in the first direction.

Hereinafter, the structure of each of the pixels PX or the sub-pixels PXn will be described in detail with reference to the other drawings.

Figure 3:
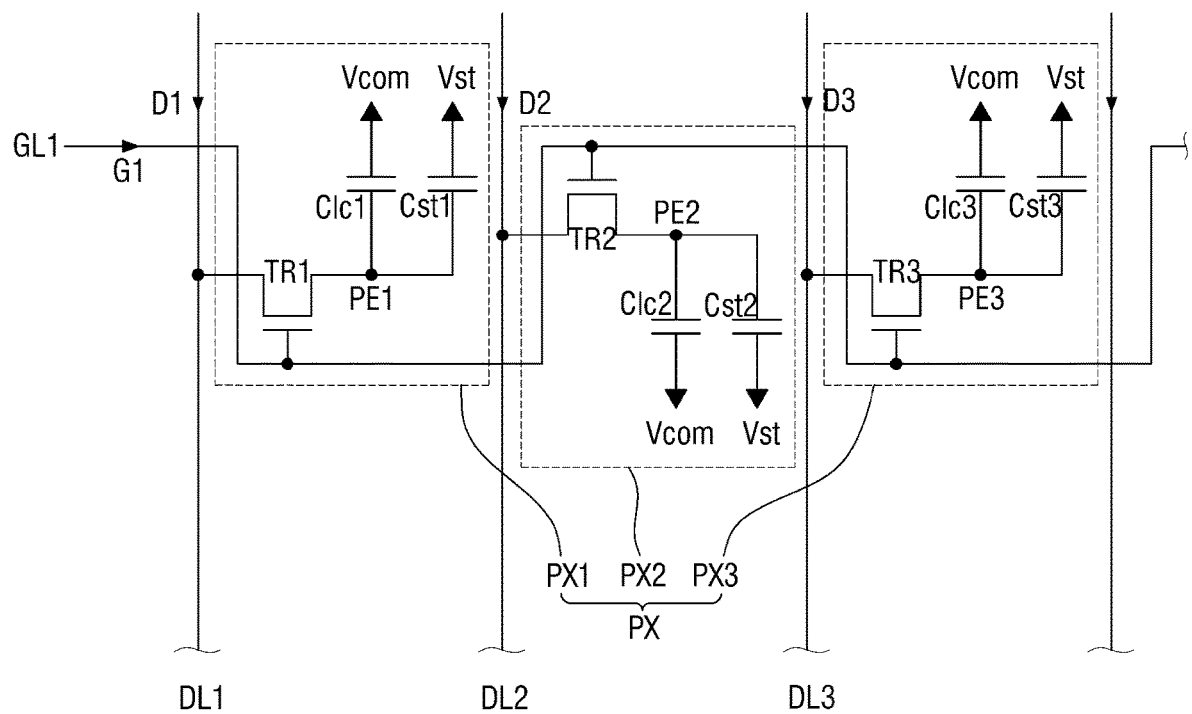
FIG. 3 is an equivalent circuit diagram of one of the pixels of FIG. 2.
Figure 3:
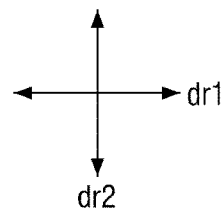

FIG. 3 is an equivalent circuit diagram of one of the pixels of FIG. 2.

FIG. 3 shows an equivalent circuit diagram of the first to third sub-pixels PX1, PX2 and PX3.

Referring to FIG. 3, the first to third sub-pixels PXn may receive different data signals D1, D2 and D3 from different data lines DL, e.g., a first data line DL1, a second data line DL2 and a third data line DL3, respectively.

The first to third data lines DL1 to DL3 may be extended in the second direction dr2 to be arranged in the pixels PX or the sub-pixels PXn adjacent to one another in the second direction dr2. Each of the data lines DL may provide the same data signal to the pixels PX or the sub-pixels PXn arranged in the same column. The different data lines DL may be spaced apart from one another in the first direction dr1. The data lines DL are arranged apart from one another, so that substantially one data line DL may be disposed in one sub-pixel PXn. Each of the data lines DL may be disposed at the boundary of the sub-pixels PXn adjacent to each other in the first direction dr1 and may be extended in the second direction dr2. The first to third sub-pixels PXn may receive the same gate signal G1 from the same gate line GL, e.g., from the first gate line GL1. The gate line GL may include first straight portions (not shown) extended in the first direction dr1, second straight portions (not shown) extended in the second direction dr2, and bent portions therebetween. Each of the first straight portions of the gate line GL is disposed in the respective sub-pixels PXn. The second straight portions are disposed to overlap with the data lines DL, respectively, so that each of the second straight portions may be disposed at the boundary of the sub-pixels PXn adjacent to each other in the first direction dr1. The bent portions include a first bent portion where the first straight portion extended in the first direction dr1 is bent in the second direction dr2, and a second bent portion where the second straight portion extended in the second direction dr2 is bent in the first direction dr1. In an exemplary embodiment, the first straight portions of the gate line GL disposed in the adjacent pixels PX or the sub-pixels PXn may be spaced apart from one another and may be extended in the first direction dr1. That is to say, the first straight portion of the first sub-pixel PX1 may be spaced apart from the first straight portion of the second sub-pixel PX2 in the second direction dr2. One second straight portion and two bent portions may be disposed between the first straight portion of the first sub-pixel PX1 and the first straight portion of the second sub-pixel PX2. Accordingly, the first straight portions of the gate line GL disposed in the adjacent pixels PX or sub-pixels PXn may be spaced apart from one another, and the sub-pixels PXn may be arranged in a staggered manner.

The first to third sub-pixels PX1, PX2 and PX3 may include transistors TR1, TR2 and TR3, pixel electrodes PE1, PE2 and PE3, liquid-crystal capacitors Clc1, Clc2 and Clc3, and storage capacitors Cst1, Cst2, Cst3, respectively. In the following description, only the first sub-pixel PX1 will be described as an example.

The first sub-pixel PX1 may include the first transistor TR1, the pixel electrode PE1, the first liquid-crystal capacitor Clc1, and the first storage capacitor Cst1.

The first transistor TR1 may be a thin-film transistor having an input electrode, an output electrode, and a control electrode, for example. In the following description, the input electrode will be referred to as a source electrode, the output electrode will be referred to as a drain electrode, and the control electrode will be referred to as a gate electrode.

The first transistor TR1 may include a first gate electrode electrically connected to the first gate line GL1, a first source electrode electrically connected to the first data line DL1, and a first drain electrode electrically connected to the pixel electrode PE1. The first drain electrode of the first transistor TR1 may be electrically connected to the pixel electrode PE. The first transistor TR1 may perform switching operation based on the first gate signal G1 received from the first gate line GL1 to provide a first data signal D1 received from the first data line DL1 to the pixel electrode PE1.

The first liquid-crystal capacitor Clc1 is formed between the pixel electrode PE1 and the common electrode CE (see FIG. 4) provided with the common voltage Vcom. The first storage capacitor Cst1 may be formed between the pixel electrode PE1 and a storage line provided with a storage voltage Vst.

As described above, the first straight portions of the gate line GL1 extended in the first direction dr1 are spaced apart from one another in the first sub-pixel PX1 and the second sub-pixel PX2. For example, the first transistor TR1 of the first sub-pixel PX1 and the second transistor TR2 of the second sub-pixel PX2 may be electrically connected to the first gate line GL1. The first transistor TR1 and the second transistor TR2 are electrically connected to the same first gate line GL1 but are connected to different first straight portions spaced apart from each other, such that they may be staggered spatially. More detailed description thereon will be made below with reference to the other drawings.

The first transistor TR1 performs switching operation based on the first gate signal G1. In addition, the second transistor TR2 performs switching operation based on the first gate signal G1. Accordingly, the first transistor TR1 and the second transistor TR2 perform the same switching operation. It is to be noted that the first transistor TR1 is electrically connected to the first data line DL1 while the second transistor TR2 is electrically connected to the second data line DL2, such that different data signals may be provided to the pixel electrode PE1 and the second pixel electrodes PE2, respectively. That is to say, the pixel electrode PE1 and the second pixel electrode PE2 may receive different data signals at the same time. Accordingly, the display device 1 according to the exemplary embodiment of the inventive concepts can be applied to a high-resolution display device requiring high-frequency driving.

Figure 4:
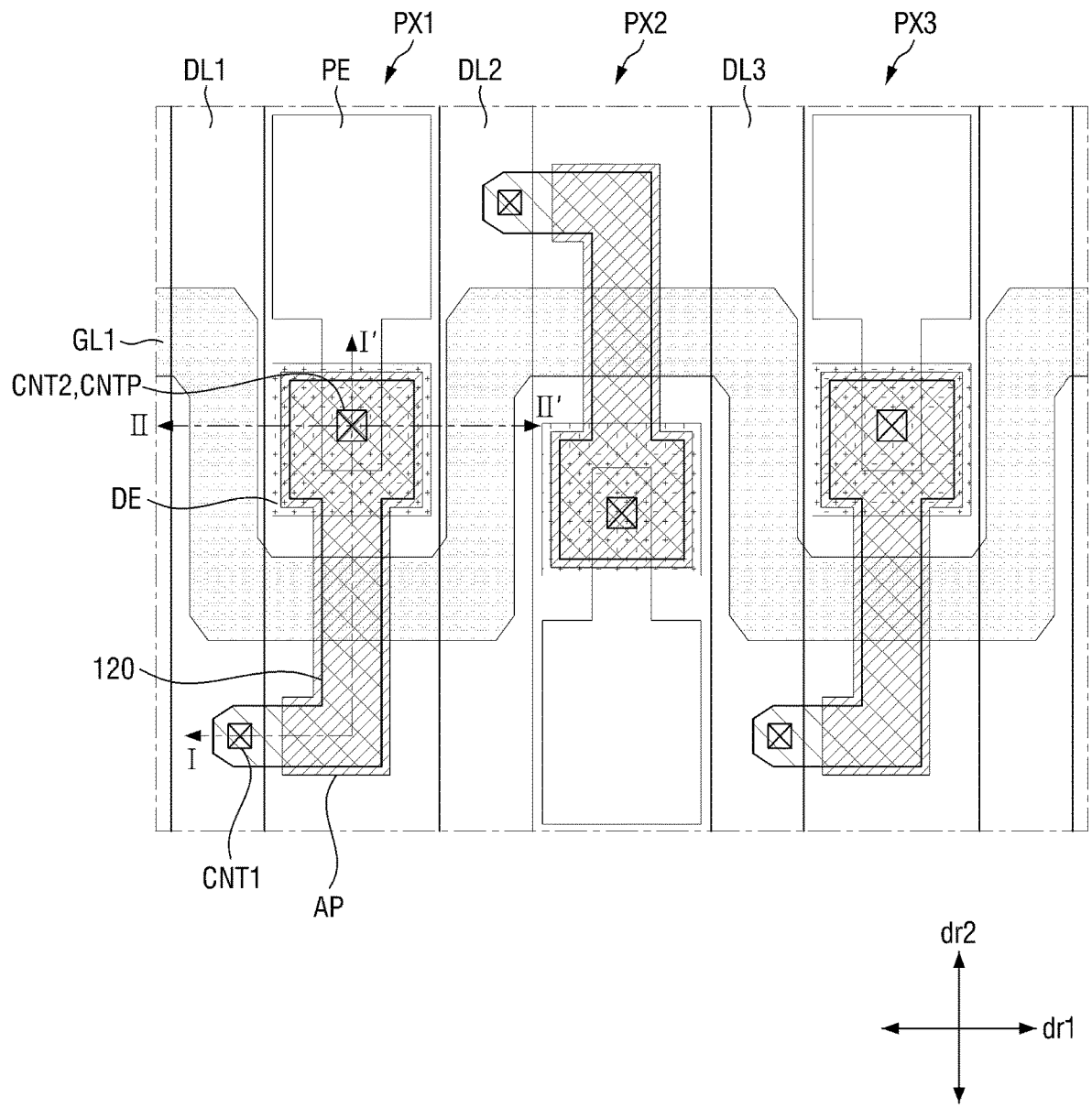
FIG. 4 is a view showing a layout of a pixel according to an exemplary embodiment of the inventive concepts.
Figure 5:
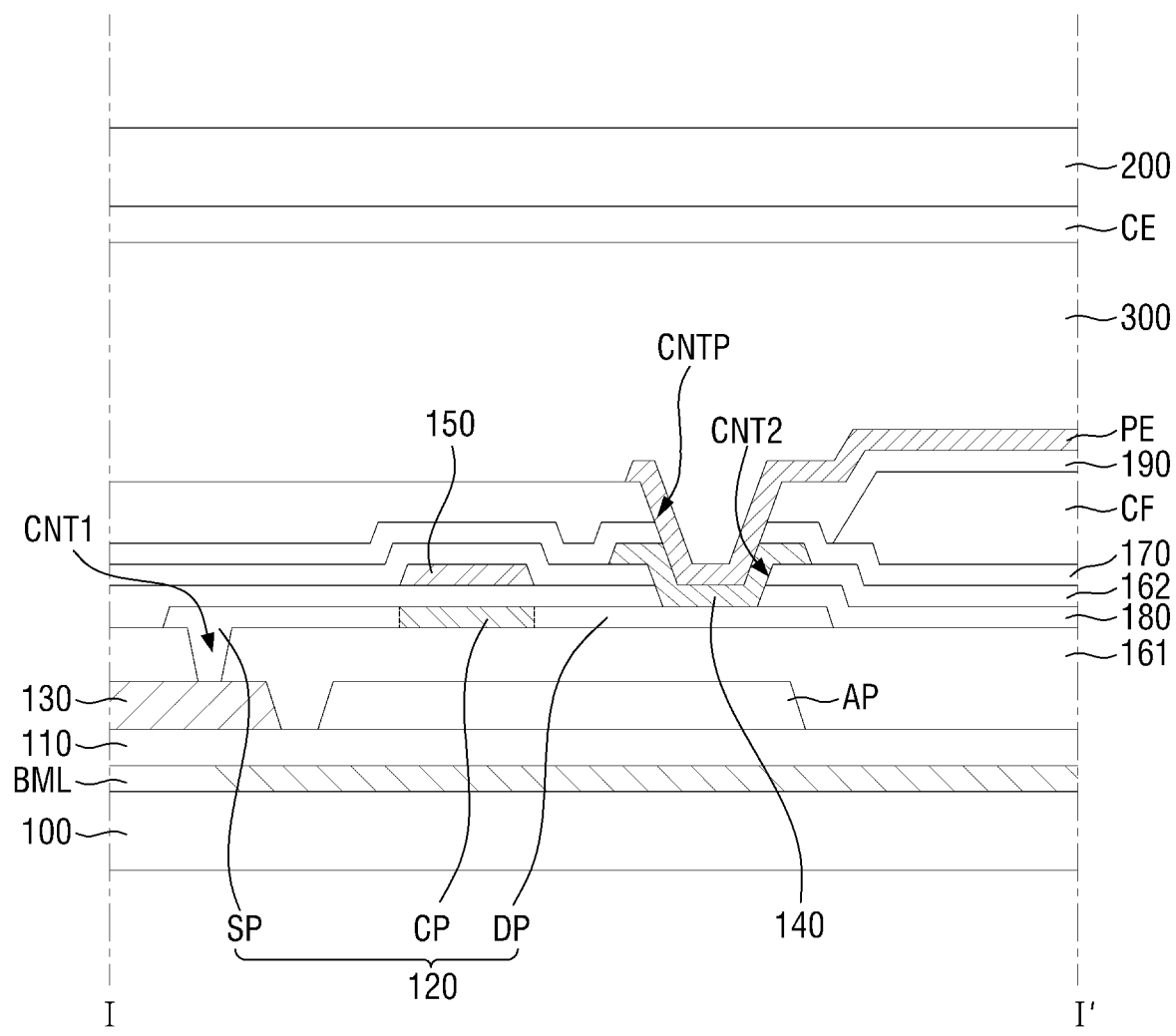
FIG. 5 is a cross-sectional view taken along line I-I' of FIG. 4.

FIG. 4 is a view showing a layout of a pixel according to an exemplary embodiment of the inventive concepts. FIG. 5 is a cross-sectional view taken along line I-I' of FIG. 4.

FIG. 4 shows a layout of the first to third sub-pixels PX1, PX2, and PX3. FIG. 5 is a cross-sectional view taken along the direction in which an active layer 120 of sub-pixels, e.g., the first sub-pixels PX1. To describe the structure of each of the sub-pixels PXn, the first sub-pixel PX1 will be described in detail. It will be appreciated that the description of the structure of the first sub-pixel PX1 can be equally applied to the other sub-pixels PXn.

Referring to FIGS. 4 and 5, each of the pixels PX of the display panel 10 may include a plurality of data lines DL, a gate line GL, a first pattern AP, an active layer 120, a first electrode DE and a pixel electrode PE.

Alternatively, each of the pixels PX or sub-pixels PXn of the display panel 10 may include a first substrate 100, a buffer layer 110, a light-blocking layer BML, a first transistor (described below), a first pattern AP, a first protective layer 170, a first insulating layer 161, a second insulating layer 162, a first gate insulating layer 180, a first planarization layer 190, a color filter CF, a pixel electrode PE, a liquid-crystal layer 300, a common electrode CE, and a second substrate 200.

The transistor of each of the pixels PX may include an active layer 120, a source electrode 130, a drain electrode 140, and a gate electrode 150.

The first substrate 100 may provide an area where the transistor (e.g., first transistor TR1) is formed. The first substrate 100 may be made of plastic or glass.

The light-blocking layer BML may be disposed on the first substrate 100. The light-blocking layer BML may block light from being incident on the active layer 120 from the first substrate 100. If light is incident on the active layer 120 from the first substrate 100, the light-blocking layer BML can prevent a leakage current flowing through the active layer 120. Although not shown in the drawings, the lengths of the light-blocking layer BML in the first direction dr1 and the second direction dr2 may be larger than the lengths of the active layer 120 in the first direction dr1 and the second direction dr2, respectively. The light-blocking layer BML may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof The buffer layer 110 may be disposed on the light-blocking layer BML. The buffer layer 110 can protect the transistor TR1 of the pixel PX from moisture permeating through the first substrate 100. The buffer layer 110 may be formed of a plurality of inorganic layers stacked on one another alternately. For example, the buffer layer 110 may be made up of multiple layers in which one or more inorganic layers of a silicon oxide layer ($SiO_x$), a silicon nitride layer ($SiN_x$) and silicon oxynitride (SiON) are stacked on one another alternately.

According to an exemplary embodiment of the inventive concepts, a plurality of data lines DL and a first pattern AP may be disposed on the buffer layer 110. As shown in FIG. 4, the data lines DL may be extended in the second direction dr2 and may be spaced apart from one another in the first direction dr1. Each of the data lines DL may be extended in the second direction dr2 at the boundary between the sub-pixels PXn adjacent to each other. The source electrodes of the transistors TR1, TR2, and TR3 of the sub-pixels PXn may be connected to the data lines DL, respectively. For example, the first transistor TR1 of the first sub-pixel PX1 may be electrically connected to the first data line DL1. That is to say, the first data line DL1 may be the source electrode 130 of the first transistor TR1.

In an exemplary embodiment, the display panel 10 may include a first pattern AP disposed between the data lines DL. The first pattern AP may have substantially the same shape as the active layer 120 disposed thereabove. The plurality of first patterns AP may be disposed in the first to third sub-pixels PX1, PX2 and PX3, respectively. Although the first patterns AP form substantially the same pattern as the active layers 120, respectively, in the example shown in the drawings, this is merely illustrative. The first patterns AP may have a linear shape extended in the second direction dr2 and spaced apart in the first direction dr1 like, the data lines DL. Alternatively, the first pattern AP may be disposed in each of the sub-pixels PXn to overlap with the first electrode DE and may have an island shape.

The first pattern AP can supplement a step difference of the first insulating layer 161 on which the active layer 120 is disposed. The plurality of data lines DL disposed on the buffer layer 110 may be spaced apart from one another, and a recessed region may be formed therebetween. According to the exemplary embodiment of the inventive concepts, by disposing the first pattern AP between the data lines DL spaced apart from each other, it is possible to supplement the step difference of the first insulating layer 161 disposed over it. A more detailed description thereon will be given below.

The first insulating layer 161 is disposed over the data line DL and the first pattern AP. The first insulating layer 161 may be formed of an inorganic material such as silicon oxide ($SiO_x$) and silicon nitride ($SiN_x$), or a stack structure thereof.

A first contact hole CNT1 may be formed through the first insulating layer 161, via which a part of the upper surface of the first data line DL1 is exposed. The first data line DL1 may be in contact with the first doped region SP through the first contact hole CNT1.

The active layer 120 is disposed on the first insulating layer 161. The active layer 120 may be disposed between the first data line DL1 and the second data line DL2 with a predetermined length, and an end thereof may be may be bent to overlap with the first data line DL1. As used herein, the phase "an element overlaps with another element" may mean that the element is in contact with another element as well as that the two elements overlap with one another in the thickness direction of a certain element (the direction perpendicular to the upper surface of the first substrate 100 in FIG. 5). The active layer 120 may be in contact with the first data line DL1 through the first contact hole CNT1 as it overlaps with the first data line DL1. That is to say, the first data line DL1 may be the source electrode 130 of the first transistor TR1.

The active layer 120 may include a first doped region SP, a second doped region DP, and a channel region CP. The channel region CP may be disposed between the first doped region SP and the second doped region DP. The first data line DL1 may be in contact with the first doped region SP through a first contact hole CNT1. The active layer 120 may include polycrystalline silicon. The polycrystalline silicon may be formed by crystallizing amorphous silicon. Examples of the crystallizing techniques may include, but is not limited to, rapid thermal annealing (RTA), solid phase crystallization (SPC), excimer laser annealing (ELA), metal induced crystallization (MILC), sequential lateral solidification (SLS), etc. As another example, the active layer 120 may include monocrystalline silicon, low-temperature polycrystalline silicon, amorphous silicon, or the like. The first doped region SP and the second doped region DP may be formed by doping some areas of the active layer 120 with impurities. The first doped region SP may be, but is not limited to being, doped at a higher concentration than the second doped region DP.

The first gate insulating layer 180 is disposed on the active layer 120. The first gate insulating layer 180 may be formed of an inorganic material such as silicon oxide ($SiO_x$) and silicon nitride ($SiN_x$), or a stack structure thereof.

The gate line GL is disposed on the first gate insulating layer 180. As described above, the gate line GL includes a plurality of first straight portions and second straight portions, and bent portion connecting them. The gate line, e.g., the first gate line GL1 may be disposed across the first sub-pixel PX1, the second sub-pixel PX2 and the third sub-pixel PX3. The first straight portions may be bent and connected to the second straight portions between the sub-pixels PXn. At least a part of each of the first straight portions of the gate line GL may overlap with the active layer 120. The gate electrode of each of transistors TR may be formed where the gate line GL overlaps with the active layer 120. In other words, the gate electrode 150 of the first transistor TR1 may be formed where the first gate line GL1 overlaps with the active layer 120.

The gate electrode 150 is disposed on the first gate insulating layer 180. The gate electrode 150 may overlap with the active layer 120 with the first gate insulating layer 180 therebetween. Specifically, the gate electrode 150 may overlap with the channel region CP of the active layer 120. The gate electrode 150 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second insulating layer 162 may be disposed on the gate electrode 150. The second insulating layer 162 may be formed of an inorganic material such as silicon oxide ($SiO_x$) and silicon nitride ($SiN_x$), or a stack structure thereof.

A second contact hole CNT2 may be formed through the second insulating layer 162 and the first gate insulating layer 180, via which a part of the upper surface of the active layer 120 is exposed. The second contact hole CNT2 may be formed so that the second doped region DP of the active layer 120 is exposed.

The first electrode DE is disposed on the second insulating layer 162. The first electrode DE may be disposed so that it partially overlaps with the active layer 120 between the data lines DL. The first electrode DE may be disposed in the first to third sub-pixels PX1, PX2 and PX3, respectively. The first electrode DE may be disposed to overlap with the other end of the active layer 120 which is opposite to the first end bent toward the first data line DL1. That is to say, with respect to the channel region CP overlapping the first gate line GL1, an end of the active layer 120 may overlap with the first data line DL1 while the other end of the active layer 120 may overlap with the first electrode DE. In an exemplary embodiment, the first data line DL1 overlapping with one end of the active layer 120 may form the source electrode 130 of the first transistor TR1 while the first electrode DE overlapping with the other end thereof may form the drain electrode 140 of the first transistor TR1. As shown in FIG. 5, the drain electrode 140 of the first transistor TR1 may be disposed on the second insulating layer 162. The drain electrode 140 may be in contact with the second doped region DP of the active layer 120 through the second contact hole CNT2.

The first protective layer 170 is disposed on the first electrode DE or the drain electrode 140. The first protective layer 170 may be formed of an inorganic material such as silicon oxide ($SiO_x$) and silicon nitride ($SiN_x$), or a stack structure thereof.

The color filters CF may be disposed on the first protective layer 170. The color filters CF may include a first color filter, a second color filter and a third color filter, which may be disposed in the first sub-pixel PX1, the second sub-pixel PX2 and the third sub-pixel PX3, respectively. Light having passed through the color filters CF may represent one of primary colors such as red, green, and blue. However, the colors of the light having passed through the color filters are not limited thereto. Each of the color filters may reproduce one of cyan, magenta, yellow and white colors. In an exemplary embodiment, the color filters CF may be formed of materials for representing different colors for different sub-pixels disposed in a pixel PX. For example, one color filter of red, green and blue may be formed in each of the first sub-pixel PX1, the second sub-pixel PX2, and the third sub-pixel PX3.

In an exemplary embodiment, the first color filter, the second color filter and the third color filter disposed in one pixel PX may be arranged in a staggered manner depending on the arrangement of each sub-pixel PXn. For example, the first color filter of the first sub-pixel PX1 and the third color filter of the third sub-pixel PX3 adjacent to the first sub-pixels PX1 in the first direction dr1 may be arranged on the same line. The second color filter of the second sub-pixel PX2 may be disposed on a line adjacent to the face in the second direction dr2 where the first color filter CF1 meets the third color filter. Accordingly, the color filters CF may also be arranged in a structure substantially similar to the sub-pixels PXn.

It is, however, to be understood that the inventive concepts are not limited thereto. In another exemplary embodiment, the sub-pixels PXn adjacent to one another in any direction may be formed of materials that reproduce different colors. Although the color filter CF is disposed on the first substrate 100 in the example shown in the drawings, it may be disposed on the second substrate 200 in some implementations.

The first planarization layer 190 is disposed on the first protective layer 170 and the color filter CF. The first planarization layer 190 may provide a flat surface over the thin-film transistor such as the first transistor TR1. The first planarization layer 190 may be formed of an organic layer such as an acryl resin, an epoxy resin, a phenolic resin, a polyamide resin and a polyimide resin.

The pixel electrode PE is disposed on the first planarization layer 190. The pixel electrode PE may be in contact with the drain electrode 140 of the first transistor TR1 through an electrode contact hole CNTP which is formed through the first planarization layer 190 and the first protective layer 170 so that a part of the upper surface of the first electrode DE or the drain electrode 140 is exposed.

The pixel electrode PE may be disposed to overlap one end of the active layer 120, the first electrode DE, and the color filter CF. A part of the pixel electrode PE may overlap with an end of the active layer 120 and the first electrode DE, to be in contact with the first electrode DE through the electrode contact hole CNTP. Another part of the pixel electrode PE may be extended onto the color filter CF.

In addition, the pixel electrode PE may overlap with the common electrode CE. Accordingly, the first liquid-crystal capacitor Clc1 of the first sub-pixel PX1 may be formed between the pixel electrode PE and the common electrode CE overlapping with each other.

The second substrate 200 is disposed to face the first substrate 100. The second substrate 200 may include substantially the same material as the first substrate 100. For example, the second substrate 200 may be made of plastic or glass.

The common electrode CE may be disposed on the second substrate 200. As described above, at least a part of the common electrode CE may overlap with the pixel electrode PE. In an exemplary embodiment, the common electrode CE may be disposed over the entire surface of the second substrate 200 regardless of the pixel PX or the sub-pixel PXn. It is, however, to be understood that the inventive concepts are not limited thereto.

The liquid-crystal layer 300 may be disposed between the pixel electrode PE of the first substrate 100 and the common electrode CE of the second substrate 200. The liquid-crystal layer 300 may include liquid-crystal molecules. The liquid-crystal molecules may have a negative dielectric anisotropy and may be vertically aligned in the initial state. The liquid-crystal molecules may have in the initial state. Although not shown in the drawings, at least one alignment layer may be disposed between the liquid-crystal layer 300 and the pixel electrode PE and between the liquid-crystal layer 300 and the common electrode CE. The liquid-crystal molecules may be initially orientated by the alignment layer. When an electric field is formed between the first substrate 100 and the second substrate 200, the liquid-crystal molecules may be tilted or rotated in a particular direction to change the polarization state of light transmitting the liquid-crystal layer 300.

Although not shown in the drawings, more elements may be disposed on the second substrate 200 besides the common electrode CE. For example, a black matrix, a planarization layer, etc. may be further disposed on the second substrate 200. The detailed description thereon will be omitted.

On the other hand, the first electrode DE and the pixel electrode PE may be sequentially disposed on one end of the active layer 120. The active layer 120 is disposed between the first data line DL1 and the second data line DL2 extended in the first direction dr1. The first pattern AP disposed under the active layer 120 with the first insulating layer 161 interposed therebetween can reduce a step difference created by the first and second data lines DL1 and DL2. The first pattern AP1 according to the exemplary embodiment of the inventive concepts can prevent the contact defect between the first electrode DE and the pixel electrode PE due to the step difference. In addition, the first pattern AP separates the data line DL disposed below the active layer 120 from the first electrode DE disposed above the active layer 120, to prevent a parasitic capacitor Cp therebetween.

Figure 6:
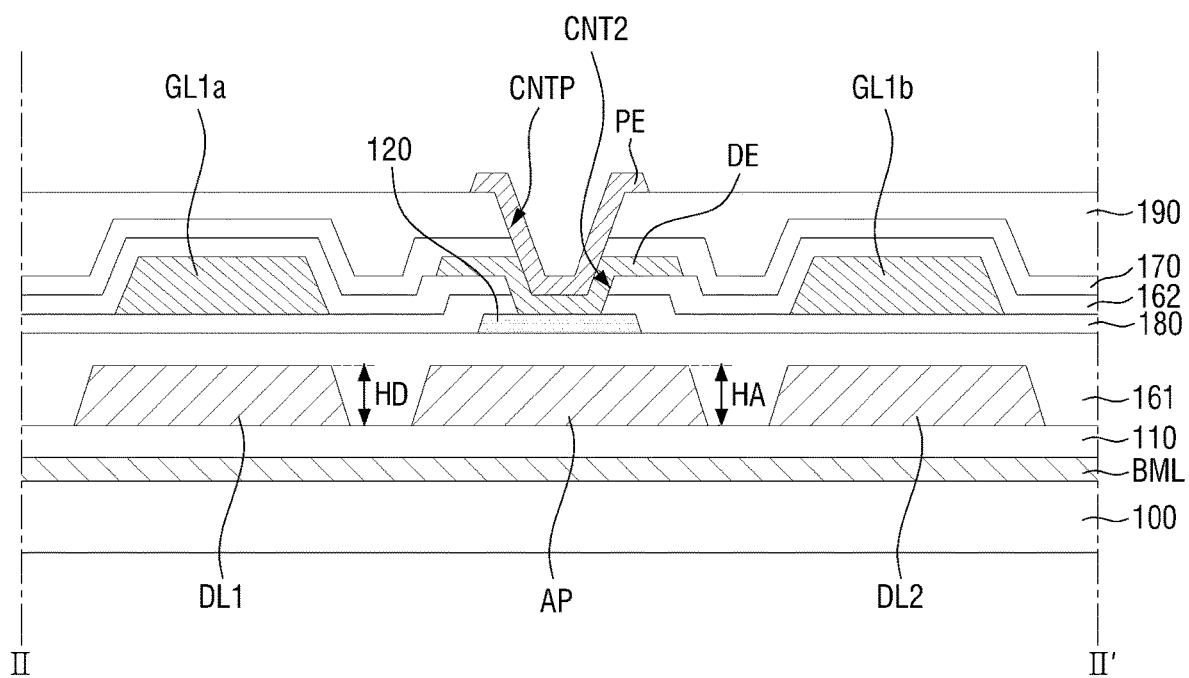
FIG. 6 is a cross-sectional view taken along line II-II' of FIG. 4.

FIG. 6 is a cross-sectional view taken along line II-II' of FIG. 4.

FIG. 6 is a cross-sectional view of the first electrode DE and the other end of the active layer 120 of the first sub-pixel PX1.

Referring to FIG. 6, the display device 1 according to the exemplary embodiment of the inventive concepts may include the active layer 120, the plurality of data lines DL (e.g., DL1 and DL2) and the first pattern AP disposed under the active layer 120, and the gate lines GL (e.g., GL1a and GL1b) and the first electrode DE disposed on the active layer 120. The elements are identical to those described above; and, therefore, the redundant description will be omitted. Description will focus on the structure shown in FIG. 6.

The plurality of data lines DL may include a first data line DL1 and a second data line DL2, and they may be spaced apart from each other. Although not shown in the cross-sectional view of FIG. 6, it can be seen from FIG. 4 that the first data line DL1 and the second data line DL2 may be extended in the first direction dr1.

The first pattern AP may be disposed between the first data line DL1 and the second data line DL2. The first pattern AP may be disposed apart from and may be formed in substantially the same shape as the first and second data lines DL1 and DL2. In particular, the height HA of the first pattern AP may be equal to the height HD of the first and second data lines DL1 and DL2. The first pattern AP may overlap with at least a part of the active layer 120. For example, the first pattern AP may be disposed to overlap with the active layer 120 that overlaps with the first electrode DE.

Referring to FIG. 4, the first electrode DE may be disposed on the other end of the active layer 120 and may be in contact with the active layer 120 through the second contact hole CNT2. The first pattern AP may be disposed to overlap with the first electrode DE so that the first electrode DE can be separated from the data line DL where it is in contact with the active layer 120. That is to say, the first pattern AP can reduce the step difference that may occur as the active layer 120 is formed above the data line DL, and is disposed where the first electrode DE is disposed so that the first electrode DE can be spaced apart from the data line DL. As shown in the drawings, the first electrode DE can be spaced apart from the data line DL at least in the direction in which the active layer 120 is stacked, e.g., the thickness direction in which the elements are stacked on one another the first substrate 100. In an exemplary embodiment, the first electrode DE may not overlap with the data lines DL in a direction parallel to the upper surface of the first substrate 100, i.e., the direction perpendicular to the direction. It is, however, to be understood that the inventive concepts are not limited thereto.

The first insulating layer 161 is disposed over the first data line DL1, the second data line DL2 and the first pattern AP. The first insulating layer 161 is disposed so as to entirely cover them and may have a flat upper surface. According to the exemplary embodiment of the inventive concepts, by virtue of the first pattern AP disposed between the first data line DL1 and the second data line DL2, the upper surface of the first insulating layer 161 can be flat, without being partially recessed. Although the first insulating layer 161 is formed as a single layer in the drawings, the inventive concepts are not limited thereto. In some implementations, the first pattern AP may be eliminated, in which case, the first insulating layer 161 may be formed as multiple layers. More detailed description thereon will be made below with reference to the other drawings.

The active layer 120 may be disposed on the first insulating layer 161 so that it partially overlaps with the first pattern AP. The active layer 120 is disposed on the first insulating layer 161 having a flat upper surface where the first pattern AP is disposed The active layer 120 may be formed above the first data line DL1 and the second data line DL2. The display device 1 according to an exemplary embodiment of the inventive concepts includes the first pattern AP so that the active layer 120 is disposed above the first and second data lines DL1 and DL2, and accordingly the first electrode DE disposed on the active layer 120 can be spaced apart from the data lines DL.

According to an exemplary embodiment of the inventive concepts, at least a part of the active layer 120 overlaps with the first pattern AP. In particular, the active layer 120 is disposed to overlap with the first pattern AP where it is in contact with the first electrode DE through the second contact hole CNT2, so that the first electrode DE in contact with the active layer 120 can be spaced apart from the data lines DL at least in the thickness direction. The first electrode DE may not overlap with the data lines DL in the direction parallel to the upper surface of the first insulating layer 161. Thus, the parasitic capacitor Cp formed between the first electrode DE and the data line DL can be reduced.

In an exemplary embodiment, the width of the active layer 120 measured in one direction may be less than the width of the first pattern AP measured in the direction. The first pattern AP may be formed to have a larger width than that of the active layer 120 so that the upper surface of the first insulating layer 161 where the active layer 120 is disposed is flat.

As shown in FIG. 4, the active layer 120 has a predetermined length and is extended in one direction, such that one end thereof may overlap with the first data line DL1 while the other end thereof may overlap with the first electrode DE and the pixel electrode PE. In addition, although not shown in the drawings, the active layer 120 may partially overlap with the first gate line GL1.

The first gate insulating layer 180 is disposed on the active layer 120.

The first gate line GL1 is disposed on the first gate insulating layer 180. As described above, the first gate line GL1 includes the plurality of straight portions and may include a first subsidiary gate line GL1a and overlapping with the first data line DL1 and a second subsidiary gate line GL2a overlapping with the second data line DL2 in the cross-sectional view. Although the first subsidiary gate line GL1a and the second subsidiary gate line GL1b are separated from each other and are given different reference numerals for convenience of illustration, they may form a substantially single first gate line GL1. The first subsidiary gate line GL1a and the second subsidiary gate line GL1b may correspond to the second straight portion of the first gate line GL1 described above with reference to FIG. 4.

The first subsidiary gate line GL1a and the second subsidiary gate line GL1b may be spaced apart from each other with the active layer 120 therebetween. The second insulating layer 162 is disposed on the first subsidiary gate line GL1a and the second subsidiary gate line GL1b.

The first electrode DE may be in contact with the active layer 120 through the second contact hole CNT2 that is formed through the first gate insulating layer 180 and the first insulating layer 161, via which a part of the upper surface of the active layer 120 is exposed. As described above, the first electrode DE may be in contact with the second doped region DP of the active layer 120 to form the drain electrode 140 of the first transistor TR1.

The first gate insulating layer 180 and the second insulating layer 162 are disposed between the first electrode DE and the active layer 120. Since only the first gate line GL1, that is, the first sub-gate line GL1a and the second sub-gate line GL1b are disposed between the first gate insulating layer 180 and the second insulating layer 162, the second insulating layer 162 where the first electrode DE is disposed may have a small step. Accordingly, the first electrode DE may be in contact with the active layer 120 even if the second contact hole CNT2 formed through the first gate insulating layer 180 and the second insulating layer 162 has a relatively small depth. In an exemplary embodiment, the height of the second contact hole CNT2 may range from 0.5 to 0.7 μm, and the width of the second contact hole CNT2 may range from 1.5 to 1.8 μm. As the step difference between the active layer 120 and the first electrode DE becomes smaller by the first pattern AP, the height of the second contact hole CNT2 becomes smaller and the width becomes wider, so that it is possible to effectively remove residues in the second contact hole CNT2 in a subsequent process.

In addition, according to an exemplary embodiment of the inventive concepts, as the active layer 120 is disposed above the data line DL by the first pattern AP, the distance between the first electrode DE and the data lines DL can be increased. Typically, a plurality of insulating layers disposed between the first electrode DE and the data lines DL may form a parasitic capacitor Cp where they overlap with one another.

In contrast, in the display device 1 according to the exemplary embodiment of the inventive concepts, the spacing distance between the first electrode DE and the data lines DL is increased by the first pattern AP, and the first electrode DE does not overlap with the data lines DL on the same horizontal plane. In other words, it is possible to prevent the parasitic capacitor Cp formed between them.

The first protective layer 170, the first planarization layer 190 and the pixel electrode PE may be disposed on the first electrode DE in this order. The elements are identical to those described above.

Hereinafter, processing steps of a method of fabricating a display device 1 according to an exemplary embodiment of the inventive concepts will be described.

FIGS. 7 to 12 are cross-sectional views showing processing steps of fabricating display devices according to an exemplary embodiment of the inventive concepts.

The process of fabricating the display device 1 will be described with reference to the cross-sectional view of FIG. 6. In other words, in order to describe the process of fabricating the display device 1, cross-sectional views of the second contact hole CNT2 via which the active layer 120 comes in contact with the first electrode DE are shown.

Figure 7:
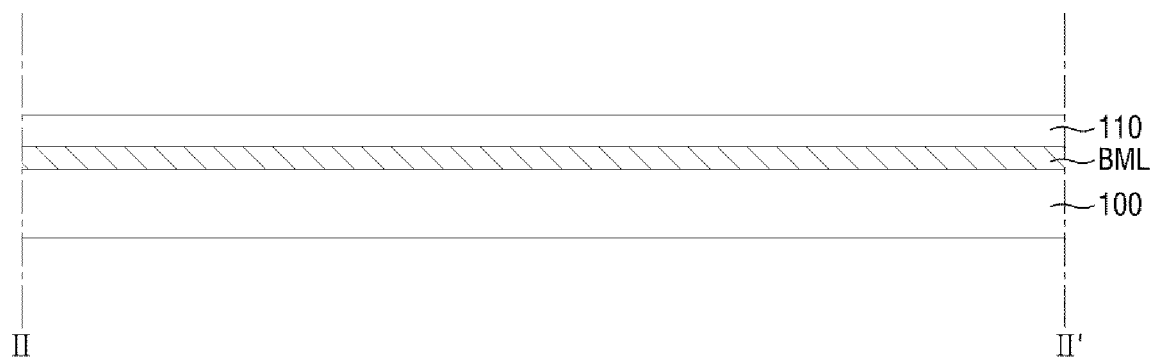
FIGS. 7, 8, 9, 10, 11, and 12 are cross-sectional views showing processing steps of fabricating display devices according to an exemplary embodiment of the inventive concepts.

Initially, referring to FIG. 7, the first substrate 100 is prepared, and a light-blocking layer BML and a buffer layer 110 are formed on the first substrate 100. Although the light-blocking layer BML covers the entire upper surface of the first substrate 100 in the example shown in FIG. 7, this is merely illustrative. It is to be noted that the buffer layer 110 may be disposed to substantially cover the upper surface of the first substrate 100.

Figure 8:
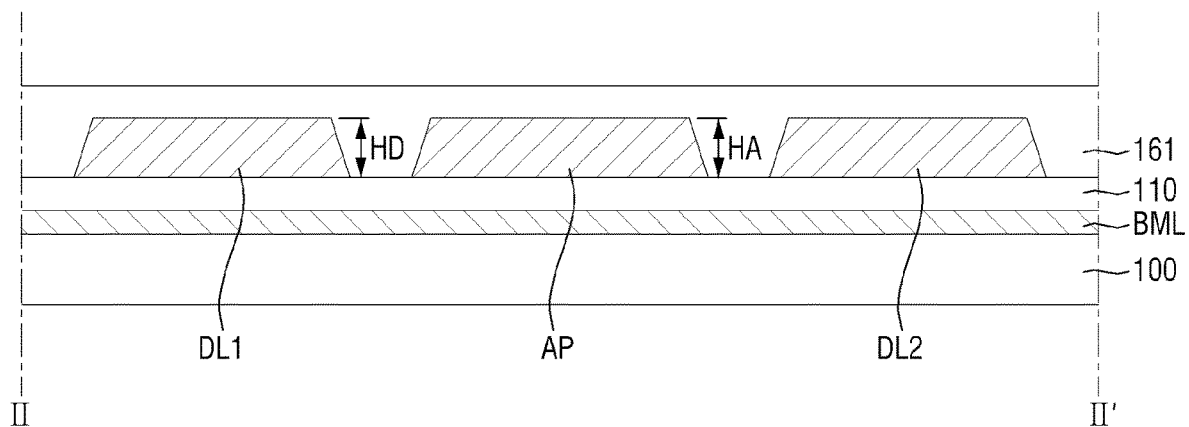

Subsequently, referring to FIG. 8, a plurality of data lines DL and a first pattern AP are formed on the buffer layer 110. A first data line DL1, a second data line DL2 spaced apart from the first data line DL1 and a first pattern AP disposed therebetween and spaced apart from them are formed on the buffer layer 110. The first pattern AP may be disposed to overlap with a part of the active layer 120 or the first electrode DE. According to an exemplary embodiment of the inventive concepts, the first pattern AP may have substantially the same shape as the data lines DL, and the height HA of the first pattern AP may be equal to the height HD of the data lines DL, as described above. It is, however, to be understood that the inventive concepts are not limited thereto.

Subsequently, the first insulating layer 161 is formed over the first and second data lines DL1 and DL2 and the first pattern AP. The first insulating layer 161 may be disposed on the buffer layer 110 so as to entirely cover the first and second data lines DL1 and DL2 and the first pattern AP and may have a flat upper surface.

Figure 9:
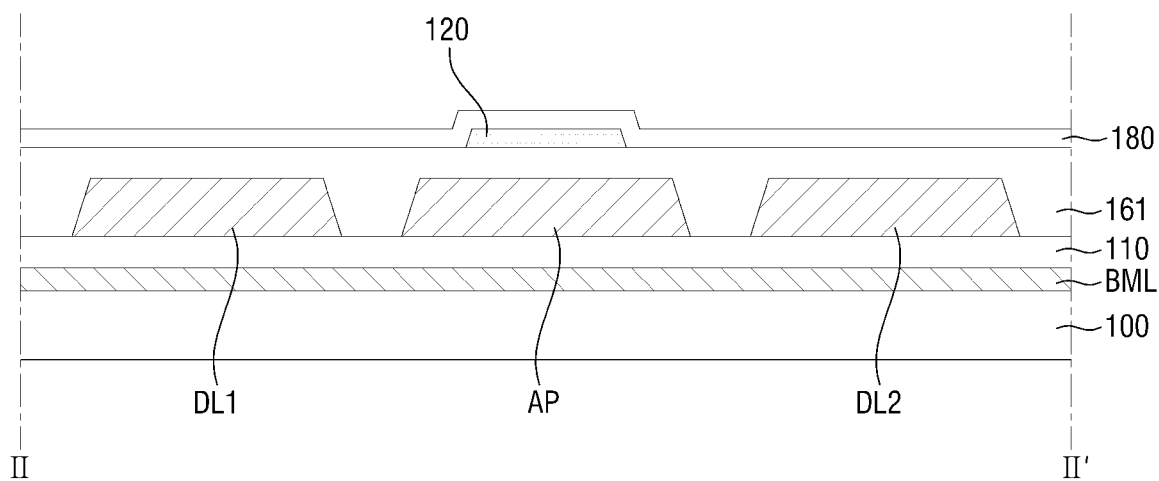

Subsequently, referring to FIG. 9, the active layer 120 is formed on a part of the upper surface of the first insulating layer 161 that overlaps with the first pattern AP, and the first gate insulating layer 180 including the active layer 120 is formed on the first insulating layer 161. At least a part of the active layer 120 may overlap with the first pattern AP. In an exemplary embodiment, the active layer 120 may overlap with the first pattern AP where it is in contact with the first electrode DE through the second contact hole CNT2. The description thereon has already been given.

Figure 10:
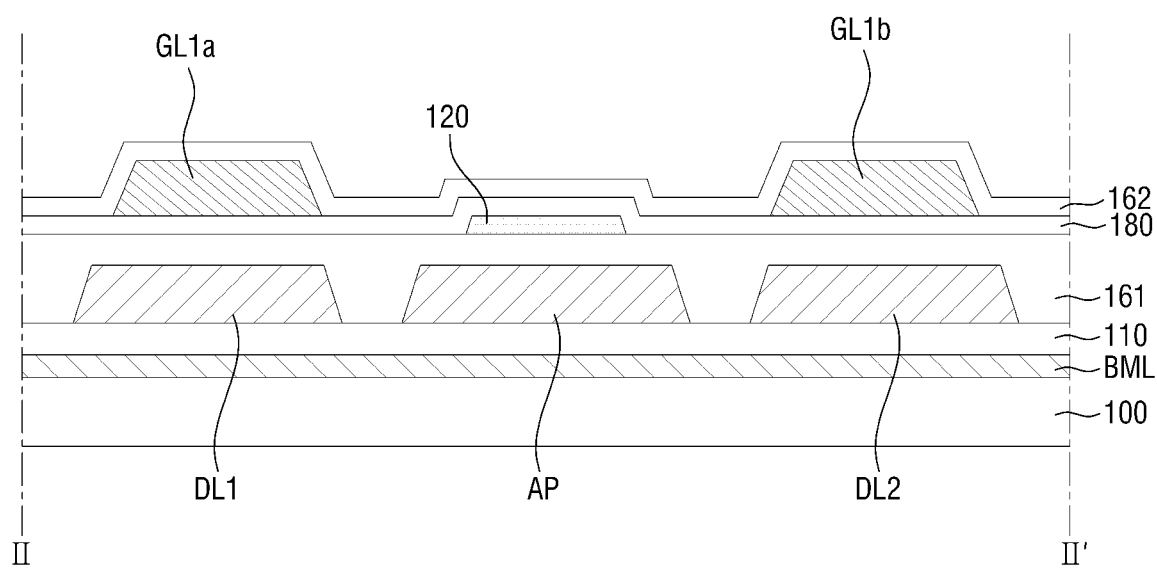

Subsequently, referring to FIG. 10, a gate line GL, that is, a first subsidiary gate line GL1a and a second subsidiary gate line GL1b are formed on the first gate insulating layer 180, and the second insulating layer 162 covering them is formed. The gate line GL is disposed to overlap with a part of the active layer 120 in the plan view while it includes the first subsidiary gate line GL1a and the second subsidiary gate line GL1b and is spaced apart from the active layer 120 in the cross-sectional view of FIG. 10. The first subsidiary gate line GL1a and the second sub-gate line GL1b are disposed above the first data line DL1 and the second data line DL2, respectively.

The second insulating layer 162 is disposed on the first gate insulating layer 180 as to cover the first subsidiary gate line GL1a and the second subsidiary gate line GL1b.

Figure 11:
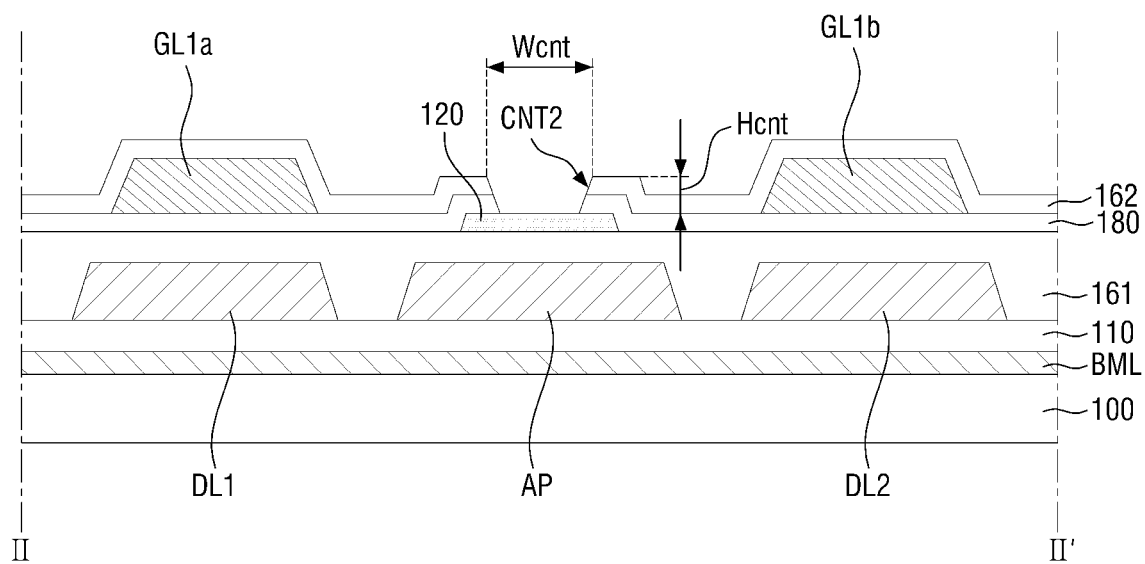

Subsequently, referring to FIG. 11, a second contact hole CNT2 is formed through the first gate insulating layer 180 and the second insulating layer 162, to expose a part of the upper surface of the active layer 120. The second contact hole CNT2 may be formed between the first subsidiary gate line GL1a and the second subsidiary gate line GL1b, via which a part of the second doped region DP (see FIG. 5) of the active layer 120 can be exposed. The active layer 120 exposed via the second contact hole CNT2 may be in contact with the first electrode DE.

According to an exemplary embodiment of the inventive concepts, the height Hcnt of the second contact hole CNT2 may range from 0.5 to 0.7 μm, and the width Wcnt of the second contact hole CNT2 may range from 1.5 to 1.8 μm. Since the first electrode DE is disposed on the second contact hole CNT2, the second contact hole CNT2 may be formed so that it substantially overlaps with the first pattern AP. A part of the active layer 120 exposed via the second contact hole CNT2 may be formed above the data lines DL by the first pattern AP and accordingly the step difference between the gate line GL and the active layer 120 can be reduced. The first gate insulating layer 180 is disposed between the gate line GL and the active layer 120, and the second insulating layer 162 is disposed thereon. That is to say, since the second contact hole CNT2 is formed by removing the first gate insulating layer 180 and the second insulating layer 162 to expose a part of the upper surface of the active layer 120, the height Hcnt of the second contact hole CNT2 is reduced while the width Wcnt is increased, so that the residues remaining in the second contact hole CNT2 can be effectively removed in the subsequent process.

Figure 12:
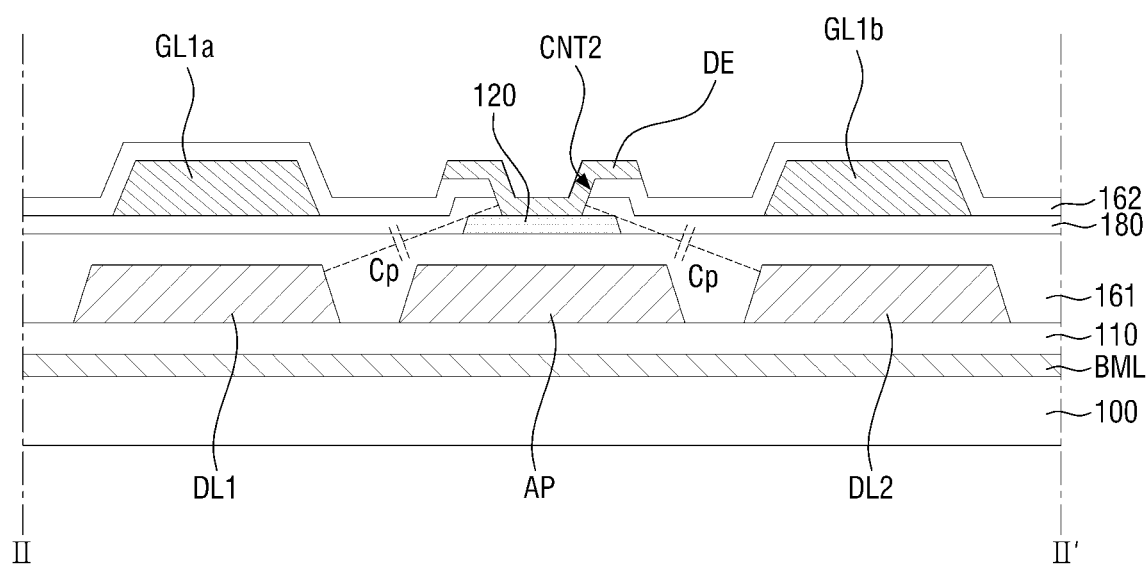

Subsequently, referring to FIG. 12, a first electrode DE is formed on the second contact hole CNT2, which is partially in contact with the active layer 120. The first electrode DE may be disposed to overlap with a part of the first pattern AP and the active layer 120 and may be in contact with the active layer 120 exposed via the second contact hole CNT2. As described above, the first electrode DE may form the drain electrode 140 of the transistor TR of each sub-pixel PXn.

In an exemplary embodiment, since the first electrode DE overlaps with the first pattern AP, it can be spaced apart from the data lines DL formed in the same layer as the first pattern AP. As the spacing distance between the first electrode DE and the data line DL is increased, the parasitic capacitor Cp between them can be reduced. In addition, as the second contact hole CNT2 in which the first electrode DE is disposed has a smaller height and a larger width, the first electrode DE, i.e., the drain electrode 140 can be reliably in contact with the active layer 120, thereby reducing contact failure.

Subsequently, although not shown in the drawings, a first protective layer 170, a color filter CF, a first planarization layer 190, and a pixel electrode PE are formed on the first electrode DE. The detailed description thereon will be omitted. By performing the above-described processes, the display device 1 according to the exemplary embodiment of the inventive concepts can be fabricated. As the display device 1 includes the first pattern AP, the active layer 120 can be disposed above the data lines DL. The first electrode DE disposed on the active layer 120 is spaced apart from the data lines DL, and the second contact hole CNT2 on which the first electrode DE is disposed can have a smaller height and a larger width. Accordingly, it is possible to effectively remove the residues remaining in the second contact hole CNT2 of the display device 1, to prevent contact failure between the first electrode DE and the active layer 120, and to suppress the parasitic capacitor Cp formed between the first electrode DE and the data lines DL.

Hereinafter, a display device 1 according to another exemplary embodiment of the inventive concepts will be described.

Figure 13:
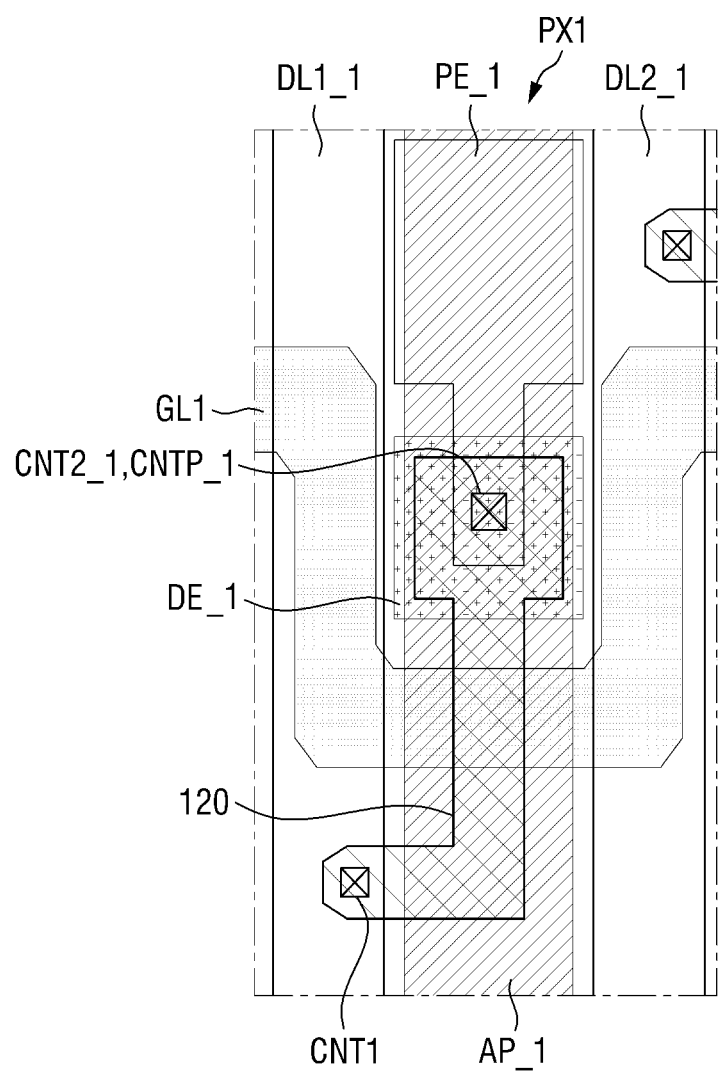
FIGS. 13 and 14 are plan views of a display device according to another exemplary embodiment of the inventive concepts.
Figure 14:
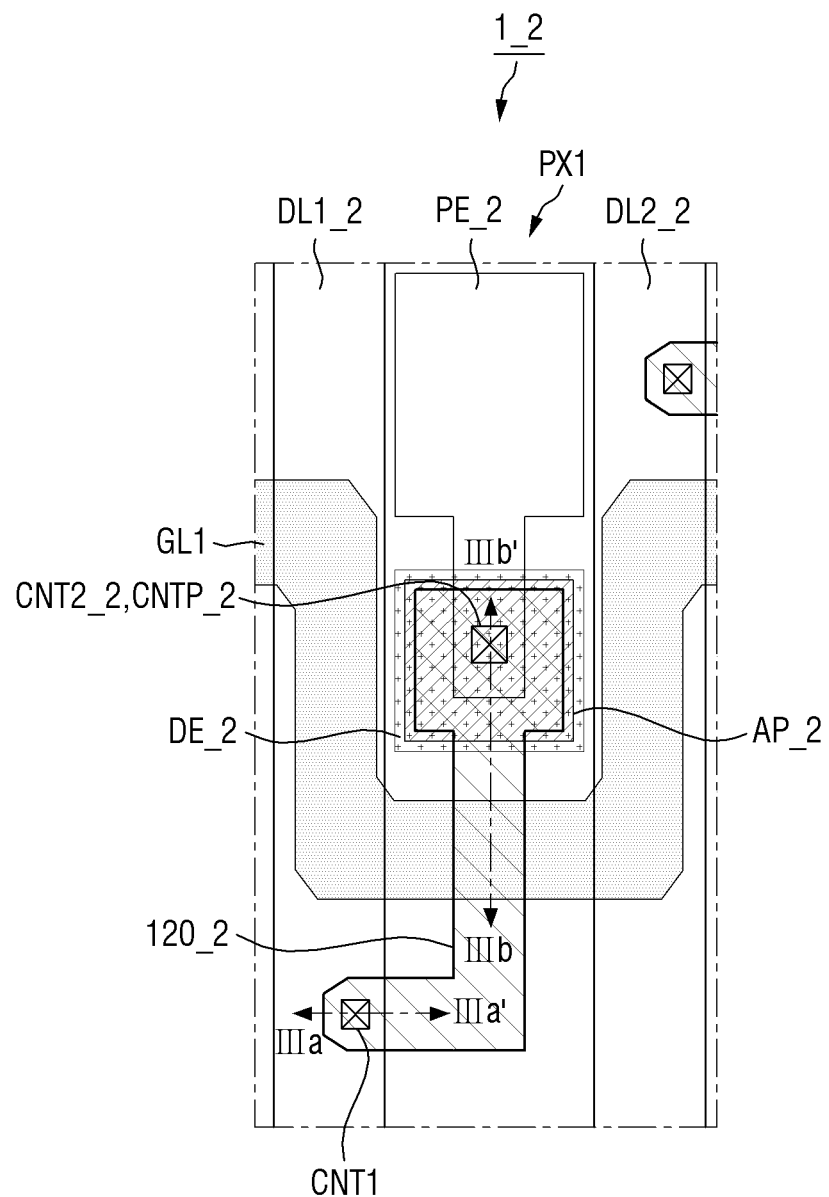

FIGS. 13 and 14 are plan views of a display device according to another exemplary embodiment of the inventive concepts.

As mentioned earlier, the first pattern AP may not necessarily have the same shape as the active layer 120. The first pattern AP may be extended in a direction like the data lines DL or may be disposed to overlap only with an end of the active layer 120 where the first electrode DE is disposed.

Initially, referring to FIG. 13, a display device according to an exemplary embodiment may include a first pattern AP_1 extended in a direction. The display device of FIG. 13 is identical to the display device 1 of FIG. 4 except that the first pattern AP_1 is extended in the second direction dr2. Hereinafter, the difference will be described in detail.

As described above, the first pattern AP_1 may be disposed to overlap with a first electrode DE_1 or a second contact hole CNT2_1. Specifically, the first pattern AP_1 may be disposed below a part of the active layer 120 that overlaps with the first electrode DE_1 or the second contact hole CNT2_1. In the display device of FIG. 13, the first pattern AP_1 is extended in the second direction dr2 and may be spaced apart from a first pattern AP_1 disposed in another sub-pixel PXn in the first direction dr1. The first pattern AP_1 may have substantially the same formation as the data lines DL_1. Specifically, the first pattern AP_1 may have a linear shape extended in the second direction dr2.

In an exemplary embodiment, the first pattern AP_1 extended in the second direction dr2 may be disposed where the active layer 120 overlaps with the first electrode DE_1. Although not shown in the drawings, a first pattern AP_1 may be extended to another sub-pixel PXn disposed in the same column and may overlap with the first electrode DE_1 of the another sub-pixel PXn. In addition, the first pattern AP_1 may partially overlap with other elements than the active layer 120 such as the gate line GL, the color filter CF and the pixel electrode PE. It is, however, to be understood that the inventive concepts are not limited thereto.

The first pattern AP may be disposed to overlap with the first electrode DE so that the first electrode DE is spaced apart from the data lines DL.

Referring to FIG. 14, in a display device 1_2 according to an exemplary embodiment of the inventive concepts, a first pattern AP_2 may overlap with at least a first electrode DE_2 of each sub-pixel PXn. Unlike the first pattern AP_1 shown in FIG. 13, different first patterns AP_2 may be disposed in the sub-pixels PXn adjacent to each other in the second direction dr2, instead of a single first pattern extended in the second direction dr2.

As described above, the first pattern AP_2 can increase the spacing distance between the first electrode DE_2 and the data line GL_2 and reduce the height of the second contact hole CNT2. That is to say, the first pattern AP_2 may not necessarily overlap with the entire region of the active layer 120_2 but may substantially overlap only with the first electrode DE_2.

In the display device 1_2 in FIG. 14, the first pattern AP_2 may overlap with the first electrode DE_2 and overlap with one end of the active layer 120_2, a part of the upper surface of which is exposed via a second contact hole CNT2_2. One first pattern AP_2 may be disposed in one sub-pixel PXn and may be spaced apart from the first pattern AP_2 adjacent to it in the first direction dr1 or the second direction dr2. The sub-pixels PXn of the display device 1_2 may be arranged in a staggered manner with the sub-pixels PXn adjacent to one another in the first direction dr1. The first pattern AP_2 may also be spaced apart in the first direction dr1 and the second direction dr2 from the first pattern AP_2 of a sub-pixel PXn adjacent to it in the first direction dr1. For example, the first sub-pixel PX1 may be disposed in a staggered manner with the second sub-pixel PX2, and may be disposed in the same row as the third sub-pixel PX3. Although not shown in the drawings, the first pattern AP_2 of the first sub-pixels PX1 may be disposed in the same row as the first pattern AP_2 of the third sub-pixels PX3 and may be spaced apart from the first pattern AP_2 of the second pixel PX2 in the second direction dr2. That is to say, the first pattern AP_2 according to the exemplary embodiment of the inventive concepts may be disposed in each sub-pixel PXn and are spaced apart from one another. They may have an island shape.

It is to be noted that the first pattern AP may be eliminated in some implementations.

Figure 15:
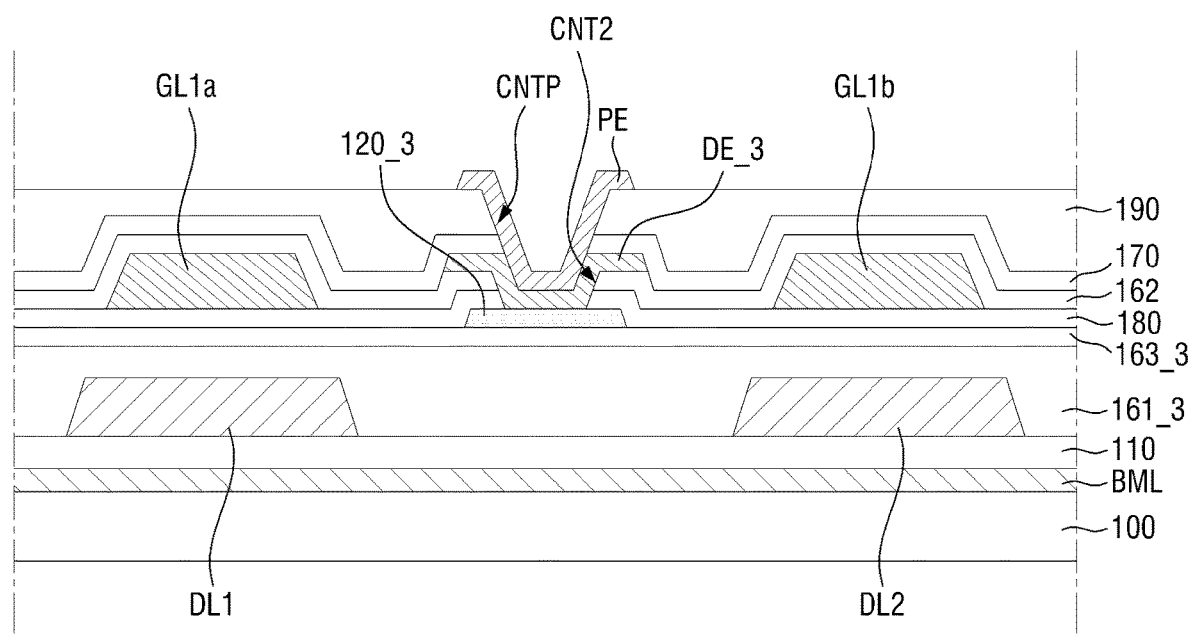
FIG. 15 is a cross-sectional view of a display device according to another exemplary embodiment of the inventive concepts.

FIG. 15 is a cross-sectional view of a display device according to another exemplary embodiment of the inventive concepts.

Referring to FIG. 15, a display device according to an exemplary embodiment of the inventive concepts may further include a third insulating layer 163_3 disposed on a first insulating layer 161_3, while the first pattern AP_3 is eliminated. In the display device of FIG. 15, the first insulating layer 161_3 and the third insulating layer 163_3 can serve as a planarization layer for provide flat surface over the step difference formed by the data lines DL.

In the exemplary embodiment, a plurality of layers may be further disposed between the first insulating layer 161_3 and the active layer 120_3. The first insulating layer 161_3 includes an organic insulating material to having a flat upper surface and covers the data line DL. The third insulating layer 163_3, which includes an inorganic insulating material may be further disposed on the first insulating layer 161_3. The active layer 120_3 may be disposed on a part of the third insulating layer 163_3. The first data line DL1 is spaced apart from the second data line DL2, such that a step difference formed therebetween may be covered by the first insulating layer 161_3 including an organic insulating material. The third insulating layer 163_3 may be disposed to cover the first insulating layer 161_3 and may include an inorganic insulating material to provide a region where the active layer 120_3 is disposed.

In the display device of FIG. 15, the first insulating layer 161_3 and the third insulating layer 163_3 can supplement the step difference formed between the data lines DL1 and DL2. Even if the first pattern AP is eliminated, the active layer 120_3 is formed above the data lines DL1 and DL2, so that the first electrode DE_3 disposed on the active layer 120_3 can be separated from the data lines DL1 and DL2.

As mentioned earlier, the arrangement of the data lines DL and the active layer 120 may be altered as long as there is spacing distance between the data lines DL and the first electrode DE. That is to say, when the first pattern AP_3 overlaps with the first electrode DE_3 so that the data lines DL1 and DL2 and the first electrode DE_3 are sufficiently separated from each other as in the display device of FIG. 15, the data lines DL1 and D12 may not necessarily be disposed below the active layer 120.

According to an exemplary embodiment of the inventive concepts, the active layer 120 may be formed first during the process of fabricating the display device 1, and the data lines may then be disposed above the active layer 120 to overlap with a part of it. The data line DL may be in contact with the active layer 120 through the first contact hole CNT1 where the data line DL overlaps with the active layer 120.

Figure 16:
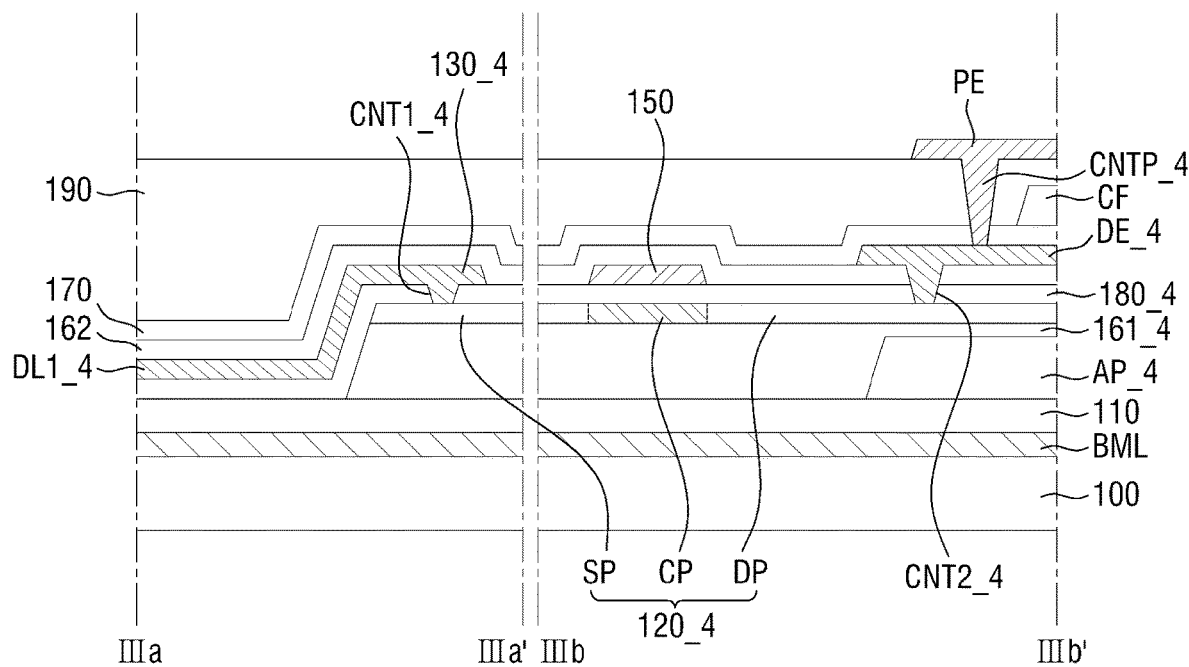
FIG. 16 is a cross-sectional view taken along lines IIIa-IIIa' and IIIb-IIIb' of FIG. 14.

FIG. 16 is a cross-sectional view taken along lines IIIa-IIIa' and IIIb-IIIb' of FIG. 14.

FIG. 16 shows a display device having a cross section different from that of the display device described above with reference to FIG. 14. Specifically, in the display device of FIG. 16, a first pattern AP_4 overlaps only with a first electrode DE_4 like the display device 1_2 of FIG. 14, and a first contact hole CNT1_4 may be formed under a data line DL_4, via which the active layer 120_4 is in contact with the data line DL_4. A part of the data line DL_4 may be disposed on the active layer 120_4 and may be in contact with the active layer 120_4 exposed via the first contact hole CNT1_4.

Referring to FIG. 16, in the display device according to the exemplary embodiment of the inventive concepts, the first pattern AP_4 may overlap with the first electrode DE_4 and the active layer 120_4 may include a part that does not overlap with the first pattern AP_4. Where the active layer 120_4 does not overlap with the first pattern AP_4, at least a part of the data line DL_4 may be disposed above the active layer 120_4.

Specifically, the display device of FIG. 16 includes a first substrate 100, a light-blocking layer BML and a buffer layer 110, and a first pattern AP_4 may be disposed on the buffer layer 110. Unlike the display device 1 of FIG. 5, the first data line DL1_4 may be formed on the first gate insulating layer 180_4 after the active layer 120_4 is formed. The first data line DL1_4 may be formed on a part of the buffer layer 110 where the first insulating layer 161_4 is not disposed after the process of forming the first pattern AP_4, the first insulating layer 161_4, the active layer 120_4 and the first gate insulating layer 180_4. A more detailed description thereon will be given later.

The first insulating layer 161_4 is disposed on the first pattern AP_4. The first insulating layer 161_4 may be disposed on the entire surface of the buffer layer 110 including the first pattern AP_4 but may not be disposed on a part of the buffer layer 110 as shown in FIG. 16. The data line DL_4 may be disposed on a part of the buffer layer 110 where the first insulating layer 161_4 is not disposed. The first insulating layer 161_4 can reduce a step difference formed by the first pattern AP_4 and can form a flat upper surface. The shape of the first insulating layer 161_4 may be formed by forming it so that it covers the buffer layer 110 substantially entirely and then patterning it along the active layer 120_4 disposed thereon.

The active layer 120_4 is disposed on the first insulating layer 161_4. The active layer 120_4 may partially overlap with the first pattern AP_4 where the first electrode DE_4 is disposed. The active layer 120_4 may be disposed on a flat upper surface of the first insulating layer 161_4. The first gate insulating layer 180_4 is disposed on the active layer 120_4. The first gate insulating layer 180_4 may be disposed on a part of the buffer layer 110 wherein the first insulating layer 161_4 is not disposed, including the active layer 120_4.

The data line DL_4, e.g., the first data line DL1_4, may be disposed on the first gate insulating layer 180_4. In an exemplary embodiment, a part of the data line DL_4 may overlap with the active layer 120_4, and the other part of the data line DL_4 may not overlap with the first insulating layer 161_4.

As described above, the data line DL_4 may be extended in the second direction dr2 in the plan view. The active layer 120_4 may include a portion bent in the first direction dr1 and may partially overlap with the data line DL_4 at the bent portion. In the display device 1 of FIG. 5, the data line DL is disposed below the active layer 120, and the first contact hole CNT1 passing through the first insulating layer 161 is formed above the data line DL.

In contrast, in the display device of FIG. 16, the active layer 120_4 is disposed above the first pattern AP_4 and on the first insulating layer 161_4, and at least a part of the data line DL_4 is disposed not to overlap with the first insulating layer 161_4. That is to say, a part of the data line DL_4 may be disposed under the active layer 120_4 like in FIG. 5. However, another part of the data line DL_4 partially overlaps with an interlayer insulating layer 161_4 and the active layer 120_4 on the first gate insulating layer 180_4. A first contact hole CNT1_4 is formed where the data line DL_4 overlaps with the active layer 120_4 on the active layer 120_4, and the data line DL_4 may be in contact with the active layer 120_4 via the first contact hole CNT1_4. The source electrode 130_4 may be formed where the data line DL_4 is in contact with the active layer 120_4.

In the display device of FIG. 16, the first pattern AP_4 overlaps only with the first electrode DE_4 like in FIG. 15, and the first electrode DE_4 can be spaced apart by a sufficient distance from the data line DL_4 where they overlap with each other. Accordingly, it is possible to suppress a parasitic capacitor Cp between them, and accordingly the arrangement of the data line DL_4 where the first electrode DE_4 is not disposed may be different from that of the display device 1_3 of FIG. 15. In an exemplary embodiment, in the first contact hole CNT1_4 which dose not face the first electrode DE_4, a part of the data line DL_4 may be disposed on the first insulating layer 161_4 and above the active layer 120_4. It is to be noted that the data line DL_4 is disposed below the active layer 120_4 where the data line DL_4 and the first electrode DE_4 face each other, and the data line DL_4 and the first electrode DE_4 are spaced apart from each other.

The gate line GL_4 may be disposed on the first gate insulating layer 180_4 and may overlap with a partial of the active layer 120_4. A channel region CP may be formed where they overlap with each other. The other elements are identical to those described above.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a data line disposed on the substrate;
a first pattern disposed on the substrate and spaced apart from the data line;
a light-blocking layer disposed between the substrate and the first pattern;
an inorganic insulating layer disposed between the light-blocking layer and the first pattern;
a first insulating layer at least partially disposed on the data line and the first pattern;
an active layer disposed on the first insulating layer and at least partially overlapping with the first pattern;
a first gate insulating layer disposed on the active layer; and
a first electrode disposed on the first gate insulating layer and overlapping with the active layer,
wherein the first electrode does not overlap with the data line in a direction parallel to an upper surface of the first insulating layer,
wherein the first electrode is in contact with the active layer via a first contact hole passing through the first gate insulating layer so that at least a part of the active layer is exposed via the first contact hole,
wherein the first electrode, the active layer, the first pattern, and the first contact hole are overlapping with each other in a direction perpendicular to an upper surface of the substrate,
wherein the first pattern is insulated from the active layer, the first electrode, and the data line, and
wherein the light-blocking layer is overlapped by the first pattern and the active layer in the direction perpendicular to the upper surface of the substrate.

2. The display device of claim 1, wherein the first electrode does not overlap with the data line in a direction perpendicular to the upper surface of the first insulating layer.

3. The display device of claim 2, wherein a width of the first pattern is larger than a width of the active layer, and a height of the first pattern is equal to a height of the data line.

4. The display device of claim 2, wherein the light-blocking layer is overlapped by the data line in the direction perpendicular to the upper surface of the substrate.

5. The display device of claim 1, wherein at least a part of the active layer overlaps with the data line.

6. The display device of claim 5, further comprising a second contact hole passing through the first insulating layer so that a part of the data line is exposed, and wherein the active layer is connected to the data line through the second contact hole.

7. The display device of claim 5, wherein at least a part of the data line overlaps with the active layer on the first gate insulating layer, and
wherein the data line is in contact with a part of the active layer via a second contact hole passing through the first gate insulating layer.

8. The display device of claim 5, further comprising:
a second insulating layer disposed between the first gate insulating layer and the first electrode; and
a gate line disposed between the first gate insulating layer and the second insulating layer.

9. The display device of claim 6, wherein a height of the first contact hole ranges from 0.5 to 0.7 µm, and a width of the second contact hole ranges from 1.5 to 1.8 µm.

* * * * *